US008953385B2

(12) United States Patent
Joo

(10) Patent No.: US 8,953,385 B2
(45) Date of Patent: Feb. 10, 2015

(54) METHOD OF PROGRAMMING NON-VOLATILE MEMORY DEVICE AND APPARATUSES FOR PERFORMING THE METHOD

(71) Applicant: Samsung Electronics Co., Ltd., Suwon-Si, Gyeonggi-Do (KR)

(72) Inventor: Sang-Hyun Joo, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/071,020

(22) Filed: Nov. 4, 2013

(65) Prior Publication Data

US 2014/0056078 A1    Feb. 27, 2014

Related U.S. Application Data

(62) Division of application No. 13/151,702, filed on Jun. 2, 2011, now Pat. No. 8,593,877.

(30) Foreign Application Priority Data

Aug. 18, 2010    (KR) ........................ 10-2010-0079881

(51) Int. Cl.
*G11C 16/34*   (2006.01)
*G11C 16/10*   (2006.01)
*G11C 16/04*   (2006.01)
*G11C 7/00*    (2006.01)
*G11C 16/30*   (2006.01)
*G11C 11/56*   (2006.01)

(52) U.S. Cl.
CPC ............ *G11C 16/30* (2013.01); *G11C 16/3454* (2013.01); *G11C 16/3459* (2013.01); *G11C 16/10* (2013.01); *G11C 11/5628* (2013.01); *G11C 16/0483* (2013.01); *G11C 16/3404* (2013.01)
USPC ............ 365/185.22; 365/185.17; 365/185.18; 365/185.28

(58) Field of Classification Search
CPC ............... G11C 16/10; G11C 16/3459; G11C 16/3454; G11C 11/5628; G11C 16/0483
USPC .......................... 365/185.18, 185.22, 185.28
See application file for complete search history.

(56) References Cited

U.S. PATENT DOCUMENTS

| | | | | |
|---|---|---|---|---|
| 7,616,496 | B2 * | 11/2009 | Choi et al. ............... | 365/185.19 |
| 2003/0103384 | A1 | 6/2003 | Takahashi | |
| 2004/0130942 | A1 | 7/2004 | Yeh et al. | |

(Continued)

FOREIGN PATENT DOCUMENTS

| | | |
|---|---|---|
| JP | 2009-032386 A | 2/2009 |
| JP | 2009-266356 A | 11/2009 |
| KR | 2009-0011249 A | 2/2009 |

*Primary Examiner* — Ly D Pham
(74) *Attorney, Agent, or Firm* — Harness, Dickey & Pierce, P.L.C.

(57) ABSTRACT

A non-volatile memory device is provided. The non-volatile memory device includes a cell string including a plurality of non-volatile memory cells; and an operation control block configured to supply a program voltage to a word line connected to a selected non-volatile memory cell among the plurality of non-volatile memory cells during a program operation, configured to supply a first negative voltage to the word line during a detrapping operation, and configured to supply a second negative voltage as a verify voltage to the word line during a program verify operation.

10 Claims, 21 Drawing Sheets

(56) References Cited

U.S. PATENT DOCUMENTS

| | | |
|---|---|---|
| 2007/0183208 A1 | 8/2007 | Tanaka et al. |
| 2008/0117688 A1 | 5/2008 | Park et al. |
| 2008/0225595 A1 | 9/2008 | Choi et al. |
| 2009/0027961 A1 | 1/2009 | Park et al. |
| 2009/0190406 A1 | 7/2009 | Tanzawa |
| 2009/0225595 A1 | 9/2009 | Kim |
| 2009/0273978 A1 | 11/2009 | Fukuda |
| 2010/0034023 A1 | 2/2010 | Shingu et al. |
| 2010/0046300 A1 | 2/2010 | Sarin et al. |
| 2010/0085112 A1 | 4/2010 | Jeon et al. |
| 2010/0157688 A1* | 6/2010 | Issaq ........................ 365/185.23 |
| 2010/0172185 A1 | 7/2010 | Kim |
| 2010/0238725 A1 | 9/2010 | Naruke |
| 2010/0238733 A1 | 9/2010 | Fukuda et al. |
| 2011/0051520 A1 | 3/2011 | Kim |
| 2011/0122706 A1 | 5/2011 | Park |
| 2012/0081957 A1* | 4/2012 | Kim et al. .................. 365/185.2 |
| 2012/0155168 A1 | 6/2012 | Kim et al. |

* cited by examiner

METHOD OF PROGRAMMING NON-VOLATILE MEMORY DEVICE AND APPARATUSES FOR PERFORMING THE METHOD

CROSS-REFERENCE TO RELATED APPLICATIONS

This application is a divisional of and claims priority under 35 U.S.C. §§120/121 to U.S. patent application Ser. No. 13/151,702, filed on Jun. 2, 2011, which claims priority under 35 U.S.C. §119 to Korean Patent Application No. 10-2010-79881 filed on Aug. 18, 2010, in the Korean Intellectual Property Office (KIPO), the entire contents of each of which are incorporated herein by reference in their entirety.

BACKGROUND

Some example embodiments relate to a non-volatile memory device, and more particularly, to a programming method for reducing charge spreading occurring after a verify operation in a non-volatile memory device by performing an operation inducing charge spreading in advance between the program operation and the verify operation of the non-volatile memory device and apparatuses for performing the method.

Flash memory is a non-volatile memory device and widely used as a storage medium for electronic devices. When flash memory is programmed, charges may move depending on a time lapse or an applied voltage (e.g., a pass voltage or a read voltage) since a program operation, thereby changing the threshold voltage of a memory cell in the flash memory. This phenomenon is referred to as charge spreading. The change in the threshold voltage led by the charge spreading causes a read margin to decrease, thereby decreasing the reliability of read data.

SUMMARY

Some example embodiments provide a programming method for reducing charge spreading occurring after a verify operation in a non-volatile memory device by performing an operation inducing charge spreading in advance between the program operation and the verify operation of the non-volatile memory device and apparatuses for performing the method.

According to some example embodiments, there is provided a method of programming a non-volatile memory device. The method includes supplying a program voltage to a selected word line, supplying a first negative voltage to the selected word line, and supplying a second negative voltage as a verify voltage to the selected word line.

The first negative voltage may be lower or higher than the second negative voltage.

According to other example embodiments, there is provided a method of programming a non-volatile memory device. The method includes the operations of supplying a program voltage to a selected word line among a plurality of word lines included in a cell string, supplying a pass voltage to unselected word lines among the plurality of word lines, and supplying one voltage among a power supply voltage and a ground voltage to a bit line connected to the cell string; supplying a first negative voltage to the selected word line and supplying a positive voltage lower than the pass voltage to the unselected word lines; and supplying a second negative voltage as a verify voltage to the selected word line.

The method may further include the operation of supplying one voltage among the power supply voltage and the ground voltage to the bit line based on the voltage that has been supplied to the bit line when the positive voltage is supplied to the unselected word lines.

The operation of supplying one voltage among the power supply voltage and the ground voltage to the bit line may include supplying the ground voltage to the bit line after the program voltage is supplied to the selected word line and the power supply voltage is supplied to the bit line; and supplying the power supply voltage to the bit line after the program voltage is supplied to the selected word line and the ground voltage is supplied to the bit line.

The method may further include the operation of supplying a voltage higher than the power supply voltage to a string selection line of the cell string when the positive voltage is supplied to the unselected word line.

The second negative voltage may be lower or higher than the first negative voltage.

According to further example embodiments, there is provided a method of programming a non-volatile memory device. The method includes the operations of supplying a program voltage to a selected word line among a plurality of word lines included in a cell string, supplying a pass voltage to unselected word lines among the plurality of word lines, and supplying one voltage among a power supply voltage and a ground voltage to a bit line connected to the cell string; supplying a positive voltage higher than the pass voltage to the unselected word lines and supplying one voltage among the power supply voltage and the ground voltage to the bit line based on the voltage that has been supplied to the bit line; and supplying a verify voltage to the selected word line.

The supplying one voltage among the power supply voltage and the ground voltage to the bit line may include supplying the ground voltage to the bit line after the program voltage is supplied to the selected word line and the power supply voltage is supplied to the bit line; and supplying the power supply voltage to the bit line after the program voltage is supplied to the selected word line and the ground voltage is supplied to the bit line.

The verify voltage may be higher or lower than the ground voltage.

According to other example embodiments, there is provided a non-volatile memory device including a cell string including a plurality of non-volatile memory cells; and an operation control block configured to supply a program voltage to a word line connected to a selected non-volatile memory cell among the plurality of non-volatile memory cells during a program operation, configured to supply a first negative voltage to the word line during a detrapping operation, and configured to supply a second negative voltage as a verify voltage to the word line during a program verify operation.

The second negative voltage may be lower or higher than the first negative voltage.

In yet other example embodiments, an electronic apparatus includes the above-described non-volatile memory device and a processor configured to control an operation of the non-volatile memory device.

In still other example embodiments, a memory card includes a card interface and a controller configured to control data exchange between the card interface and the above-described non-volatile memory device.

According to further example embodiments, there is provided a non-volatile memory device including a cell string including a plurality of non-volatile memory cells; and an operation control block configured to supply a program voltage to a first word line connected to a selected first nonvolatile memory cell among the plurality of non-volatile memory cells and a pass voltage to second word lines connected to unselected second non-volatile memory cells among the plurality of non-volatile memory cells during a program operation, configured to supply a negative voltage to the first word line and a positive voltage lower than the pass voltage to the second word lines during a detrapping operation, and configured to supply a verify voltage to the first word line during a program verify operation.

The operation control block may be configured to supply a ground voltage to a bit line connected to the cell string during the detrapping operation when a power supply voltage is supplied to the bit line during the program operation and configured to supply the power supply voltage to the bit line during the detrapping operation when the ground voltage is supplied to the bit line during the program operation.

The operation control block may be configured to supply a voltage higher than the power supply voltage to a string selection line of the cell string when the negative voltage is supplied to the first word line.

In yet other example embodiments, an electronic apparatus includes the above-described non-volatile memory device and a processor configured to control an operation of the non-volatile memory device.

In still other example embodiments, a memory card includes a card interface and a controller configured to control data exchange between the card interface and the above-described non-volatile memory device.

According to further example embodiments, there is provided a non-volatile memory device including a cell string including a plurality of non-volatile memory cells; and an operation control block configured to supply a program voltage to a first word line connected to a selected first non-volatile memory cell among the plurality of non-volatile memory cells and a pass voltage to second word lines connected to unselected second non-volatile memory cells among the plurality of non-volatile memory cells during a program operation, configured to supply a ground voltage to the first word line and a positive voltage higher than the pass voltage to the second word lines during a detrapping operation, and configured to supply a verify voltage to the first word line during a program verify operation.

The operation control block may supply a ground voltage to a bit line connected to the cell string during the detrapping operation when a power supply voltage is supplied to the bit line during the program operation and may supply the power supply voltage to the bit line during the detrapping operation when the ground voltage is supplied to the bit line during the program operation.

In yet other example embodiments, an electronic apparatus includes the above-described non-volatile memory device and a processor configured to control an operation of the non-volatile memory device.

In still other example embodiments, a memory card includes a card interface and a controller configured to control data exchange between the card interface and the above-described non-volatile memory device.

According to some example embodiments, a non-volatile memory device may include a cell string including a plurality of non-volatile memory cells; and an operation control block, the operation control block being configured to apply a program voltage to a word line connected to a selected non-volatile memory cell among the plurality of non-volatile memory cells during a program operation, the operation control block being configured to apply a first detrapping voltage and a second detrapping voltage during a detrapping operation, the first detrapping voltage being applied to the word line connected to the selected non-volatile memory cell and the second detrapping voltage being applied to word lines connected to unselected non-volatile memory cells, the first detrapping voltage being lower than the second detrapping voltage, and the operation control block being configured to supply a verify voltage to the word line during a program verify operation.

According to some example embodiments, the first detrapping voltage may be a first negative voltage, and the verify voltage may be a second negative voltage.

According to some example embodiments, the operation control block may be further configured to apply a pass voltage to the word lines connected to the unselected non-volatile memory cells among the plurality of non-volatile memory cells during a program operation, and the first detrapping voltage may be a negative voltage and the second detrapping voltage may be a positive voltage lower than the pass voltage.

According to some example embodiments, the operation control block may be further configured to apply pass voltage to the word lines connected to the unselected non-volatile memory cells among the plurality of non-volatile memory cells during a program operation, and the first detrapping voltage may be a ground voltage and the second detrapping voltage may be a positive voltage higher than the pass voltage.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EMBODIMENTS

Figure 1:
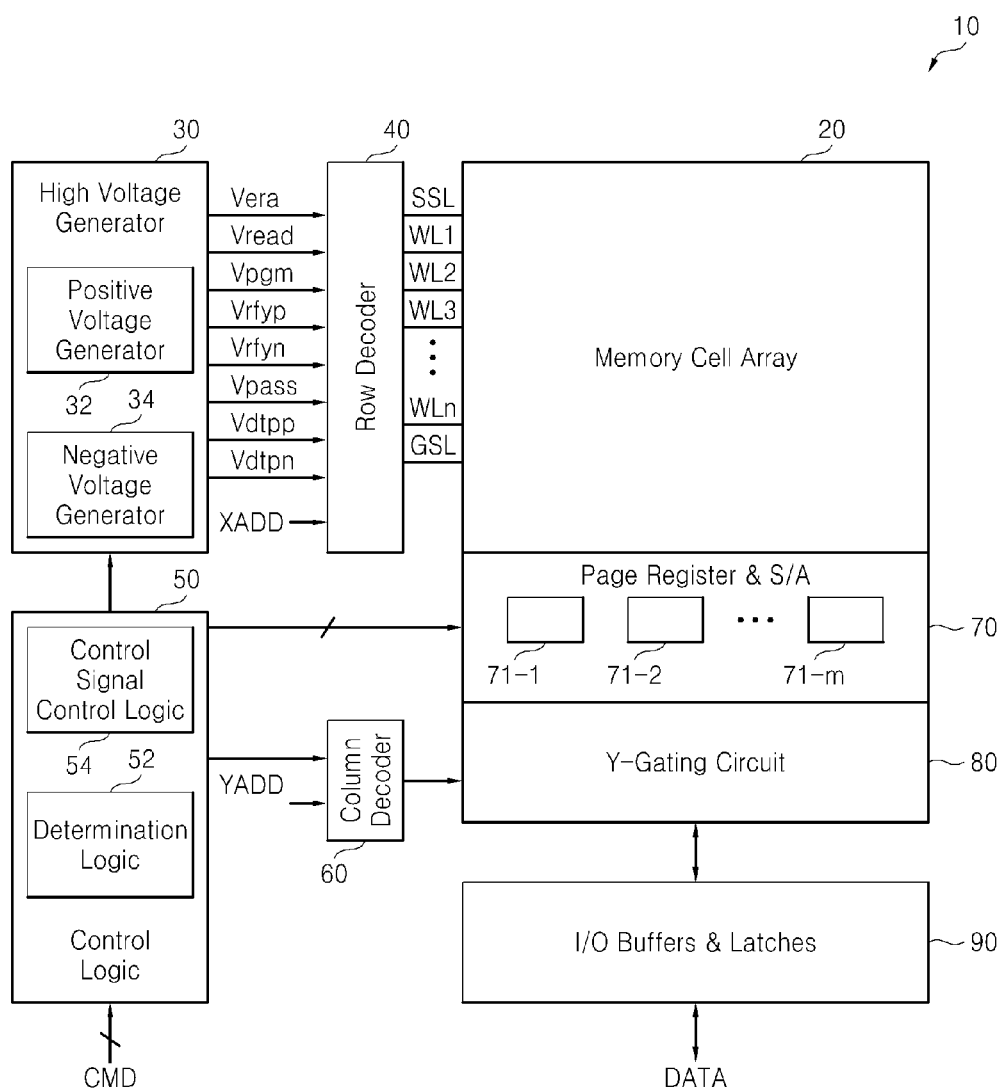
FIG. 1 is a block diagram of a non-volatile memory device according to some example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
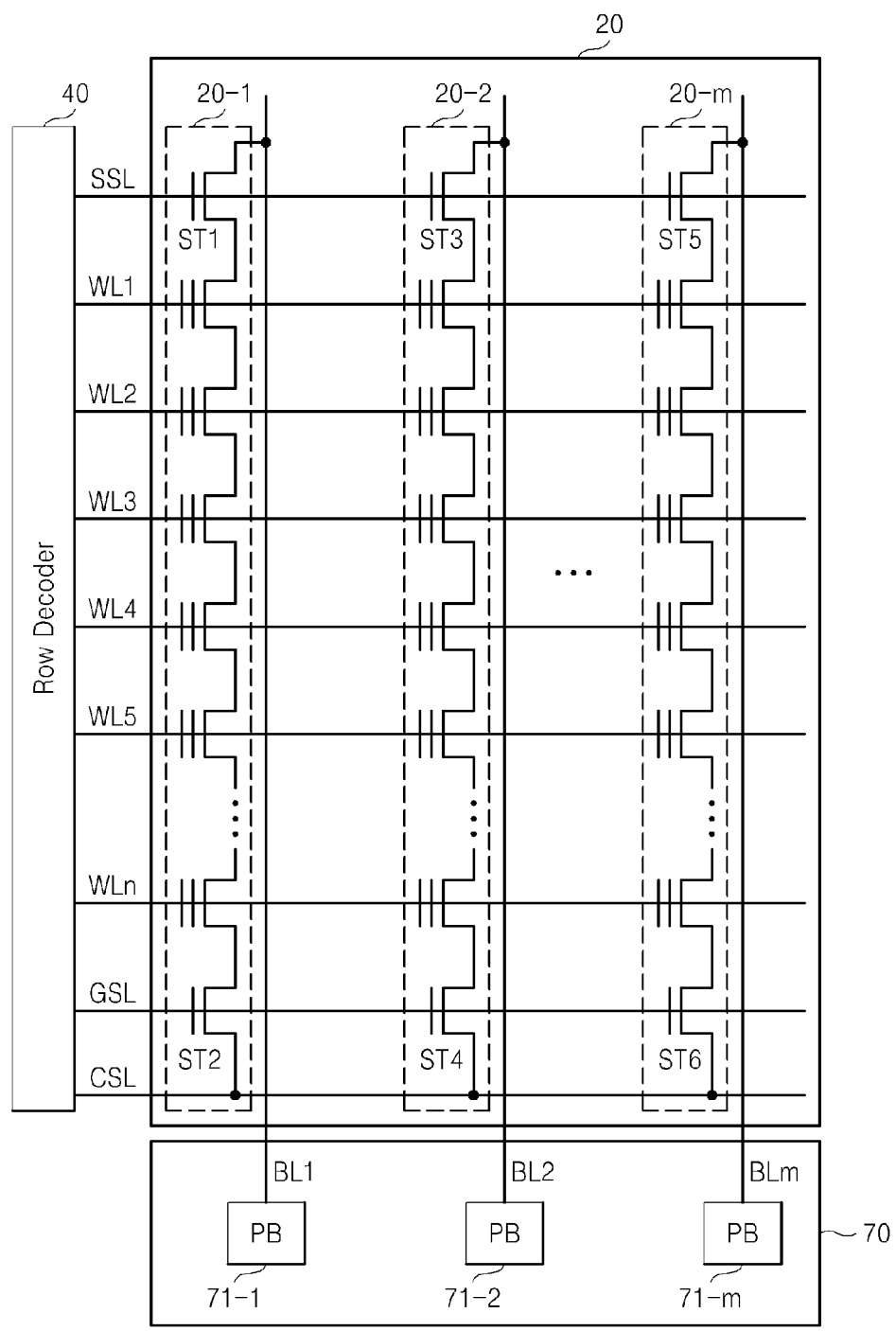
FIG. 2 is a detailed block diagram of a memory cell array, a row decoder, and a page register and sense amplifier (S/A) block when the memory cell array illustrated in FIG. 1 is implemented in two dimensions.

FIG. 1 is a block diagram of a non-volatile memory device 10 according to some example embodiments. FIG. 2 is a detailed block diagram of a memory cell array 20, a row decoder 40, and a page register and sense amplifier (S/A) block 70 when the memory cell array 20 illustrated in FIG. 1 is implemented in two dimensions. Referring to FIGS. 1 and 2, the non-volatile memory device 10 includes the memory cell array 20, an operation control block, and an input/output (I/O) buffer and latch block 90.

Figure 3:
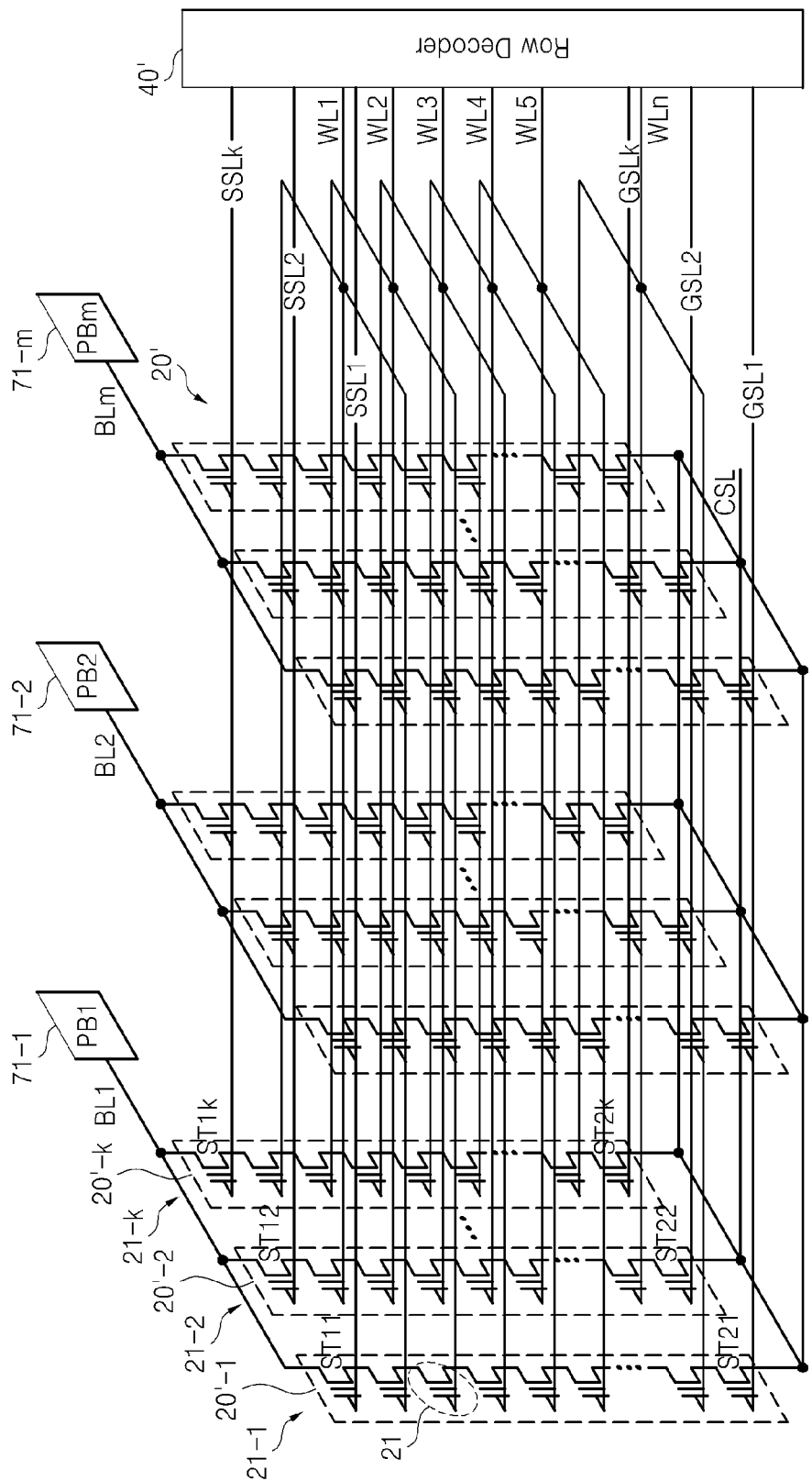
FIG. 3 is a diagram of a memory cell array, a row decoder, and page buffers when the memory cell array illustrated in FIG. 1 is implemented in three dimensions.

The memory cell array 20 includes a plurality of cell strings 20-1, 20-2, . . . , and 20-*m* where "m" is a natural number. Each of the cell strings 20-1 through 20-*m* includes a plurality of non-volatile memory cells. The memory cell array 20 may include the cell strings 20-1 through 20-*m* disposed in two dimensions on one plane as illustrated in FIG. 2 or may include cell strings 20'-1 through 20'-*k* disposed in three dimensions on different planes or layers as illustrated in FIG. 3. Referring to FIG. 3, the first cell string 20'-1 is disposed on a first layer 21-1, the second cell string 20'-2 is disposed on a second layer 21-2 different from the first layer 21-1, and the k-th cell string 20'-*k* is disposed on a k-th layer 21-*k* different from the second layer 21-2.

The cell string 20-1 illustrated in FIG. 2 includes a first selection transistor ST1 connected to a bit line BL1, a second selection transistor ST2 connected to a ground, and a plurality of non-volatile memory cells connected in series between the first and second selection transistors ST1 and ST2. The cell string 20-2 includes a third selection transistor ST3 connected to a bit line BL2, a fourth selection transistor ST4 connected to the ground, and a plurality of non-volatile memory cells connected in series between the third and fourth selection transistors ST3 and ST4. The cell string 20-*m* includes a fifth selection transistor ST5 connected to a bit line BLm, a sixth selection transistor ST6 connected to the ground, and a plurality of non-volatile memory cells connected in series between the fifth and sixth selection transistors ST5 and ST6.

The non-volatile memory cells included in each of the cell strings 20-1 through 20-*m* may be implemented by electrically erasable programmable read-only memory (EEPROM) cells that can store one or more bits. The non-volatile memory cells may be implemented by NAND flash memory cells, e.g., single level cells (SLCs) or multi-level cells (MLCs), which can store one or more bits. Accordingly, the cell strings 20-1 through 20-*m* may be referred to as NAND strings.

FIG. 3 is a diagram of a memory cell array 20', a row decoder 40', and page buffers 71-1 through 71-*m* when the memory cell array 20 illustrated in FIG. 1 is implemented in three dimensions. Referring to FIG. 3, each of the layers 21-1 through 21-*k* (where "k" is a natural number) includes a plurality of cell strings.

The layers 21-1 through 21-*k* may be implemented by the stack or wafers, chips, or cells. The layers 21-1 through 21-*k* may be electrically connected with one another using a through hole such as a through-silicon via (TSV), wire bonding, a bump, or a combination thereof.

The first cell string 20'-1 in the first layer 21-1 includes a plurality of non-volatile memory cells, e.g., NAND flash memory cells, connected in series between a plurality of selection transistors ST11 and ST21. The second cell string 20'-2 in the second layer 21-2 includes a plurality of non-volatile memory cells, e.g., NAND flash memory cells, connected in series between a plurality of selection transistors ST12 and ST22. The k-th cell string 20'-$k$ in the k-th layer 21-$k$ includes a plurality of non-volatile memory cells, e.g., NAND flash memory cells, connected in series between a plurality of selection transistors ST1k and ST2k.

The row decoder 40' illustrated in FIG. 3 provides selection signals (e.g., a read voltage Vread during a read operation, a power supply voltage VDD during a program operation, and 0 V during an erase operation) to string selection lines SSL1, SSL2, . . . , and SSLk connected to the gates of the first selection transistors ST11, ST12, . . . , and ST1k, respectively, implemented in the layers 21-1 through 21-$k$, respectively. Accordingly, the first selection transistors ST11 through ST1k are selectively turned on or off.

The row decoder 40' also provides selection signals (e.g., the read voltage Vread during the read operation and 0 V during the program operation and the erase operation) to ground selection lines GSL1, GSL2, . . . , and GSLk connected to the gates of the second selection transistors ST21, ST22, . . . , and ST2k, respectively, implemented in the layers 21-1 through 21-$k$, respectively. Accordingly, the second selection transistors ST21 through ST2k are selectively turned on or off. In other words, each of the cell strings 20'-1 through 20'-$k$ implemented in the respective layers 21-1 through 21-$k$ may be selected by the row decoder 40'.

As illustrated in FIG. 3, the cell strings 20'-1 through 20'-$k$ may share with one another a plurality of word lines WL1 through WLn, a common source line CSL, and a bit line BL1. In other words, cell strings at corresponding positions in the respective layers 21-1 through 21-$k$ may be connected to a corresponding one among the page buffers 71-1 through 71-$m$ included in the page register and S/A block 70.

Hereinafter, the operations of the non-volatile memory device 10 will be described on the assumption that the cell string 20'-1 in the first layer 21-1 among the layers 21-1 through 21-$k$ in the three-dimensional memory cell array 20' is selected by the row decoder 40'. In addition, the memory cell array 20 represents the two-dimensional memory cell array 20 illustrated in FIG. 2 and three-dimensional memory cell array 20' illustrated in FIG. 3 and the row decoder 40 represents the row decoder 40 illustrated in FIG. 2 and the row decoder 40' illustrated in FIG. 3.

The operation control block includes a voltage supply circuit, a control logic 50, a column decoder 60, the page register and S/A block 70, and a Y-gating circuit 80.

During a verify operation, the voltage supply circuit may generate either a positive verify voltage Vvfyp or a negative verify voltage Vvfyn according to voltage selection information generated by the control logic 50 and supplies the generated voltage to a word line selected by a row address XADD from among the word lines WL1 through WLn. During a detrapping operation, the voltage supply circuit may generate either a positive detrapping voltage Vdtpp or a negative detrapping voltage Vdtpn according to voltage selection information generated by the control logic 50 and supply the generated voltage to a word line selected or word lines unselected by the row address XADD from among the word lines WL1 through WLn.

The detrapping operation is a process of supplying the detrapping voltage Vdtpp or Vdtpn between a program operation and a verify operation in order to shift charges trapped in a selected memory cell. The detrapping voltage Vdtpp or Vdtpn may be the negative voltage Vdtpn supplied to a selected word line or the positive voltage Vdtpp supplied to unselected word lines between the program operation and the verify operation in order to reduce the change occurring in the threshold voltage of the selected memory cell due to charge spreading.

The voltage supply circuit includes a high voltage generator 30 and the row decoder 40. The high voltage generator 30 is controlled by the control logic 50 to generate a plurality of voltages including a program voltage Vpgm necessary for a program operation, a plurality of voltages including the read voltage Vread necessary for a read operation, a plurality of voltage including the detrapping voltage Vdtpp or Vdtpn necessary for a detrapping operation, a plurality of voltage including the verify voltage Vvfyp or Vvfyn necessary for a verify operation, or a plurality of voltage including an erase voltage Vera necessary for an erase operation and to output the plurality of voltages to the row decoder 40. The high voltage generator 30 includes a positive voltage generator 32 which generates the positive verify voltage Vvfyp and the positive detrapping voltage Vdtpp according to voltage selection information generated by the logic control 50 and a negative voltage generator 34 which generates the negative verify voltage Vvfyn and the negative detrapping voltage Vdtpn according to the voltage selection information.

The control logic 50 controls the operations of the operation control block and the I/O buffer and latch block 90 according to an external command CMD, e.g., a program command, a detrapping command, or a verify command. The control logic 50 may generate voltage selection information and a plurality of control signals according to a detrapping sequence or a verify sequence.

The determination logic 52 included in the control logic 50 generates the voltage selection information according to the detrapping sequence or the verify sequence and outputs the voltage selection information to the high voltage generator 30 and a control signal control logic 54. Here, "logic" may indicate a hardware or a program that can drive a hardware. The determination logic 52 may be implemented by a state machine.

During a verify operation, the high voltage generator 30 may generate either the positive verify voltage Vvfyp or the negative verify voltage Vvfyn according to the voltage selection information generated by the control logic 50. During a detrapping operation, the high voltage generator 30 may generate either the positive detrapping voltage Vdtpp or the negative detrapping voltage Vdtpn according to the voltage selection information generated by the control logic 50.

The page register and S/A block 70 includes the plurality of the page buffers 71-1 through 71-$m$. Each of the page buffers 71-1 through 71-$m$ is controlled by the control logic 50 to operate as a driver for programming data to the memory cell array 20 during a program operation and operate as an S/A for identifying the threshold voltage of a memory cell selected from among the plurality of non-volatile memory cells included in the memory cell array 20 during a verify operation.

The column decoder 60 is controlled by the control logic 50 to decode a column address YADD and output the decoded signal to the Y-gating circuit 80. The Y-gating circuit 80 controls data transfer between the page register and S/A block 70 and the I/O buffer and latch block 90 in response to the decoded signal output from the column decoder 60. The I/O buffer and latch block 90 transmits data DATA to the Y-gating circuit 80 or to an external device (not shown) through a data bus (not shown).

Figure 4:
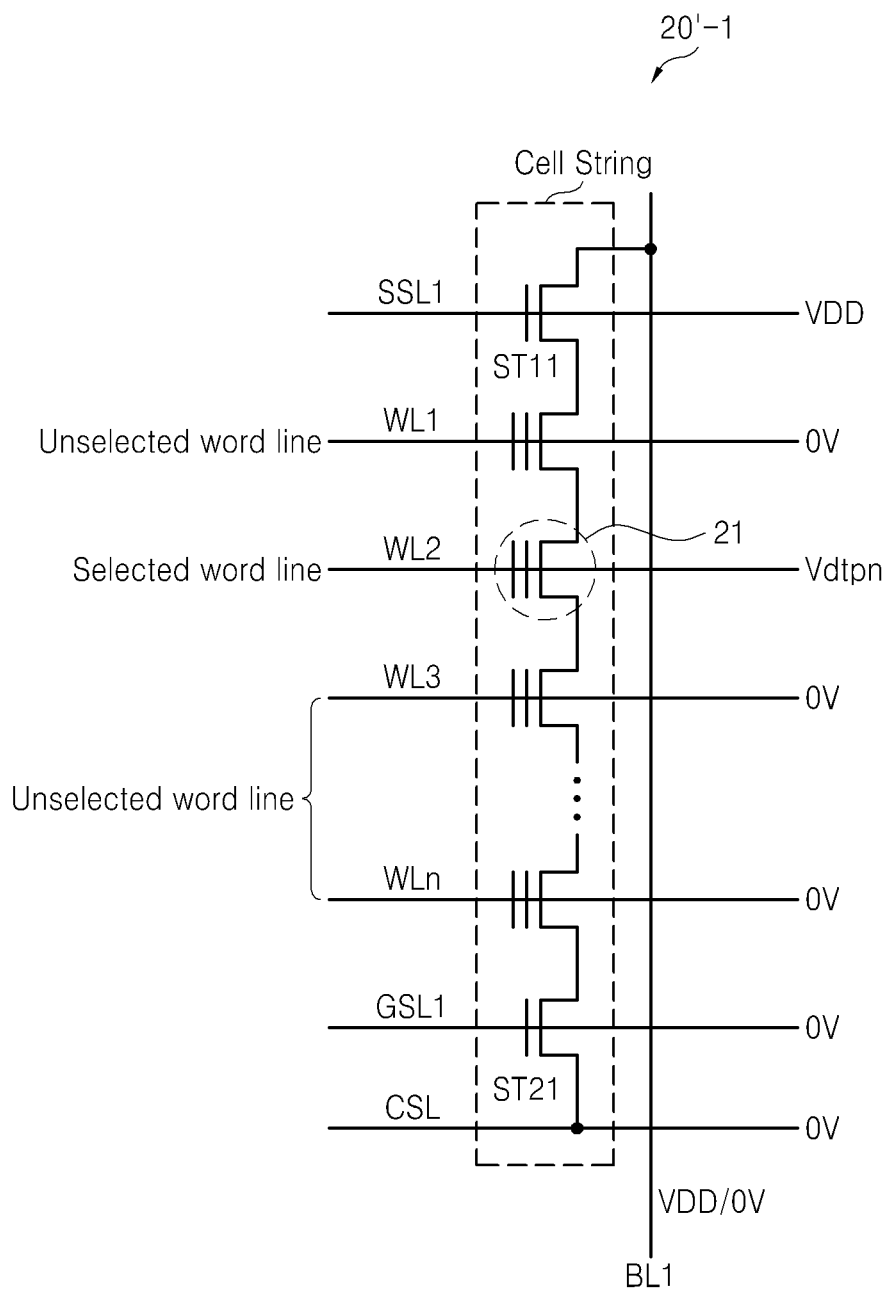
FIG. 4 is a diagram showing voltages applied to a cell string during detrapping according to some example embodiments.
Figure 5:
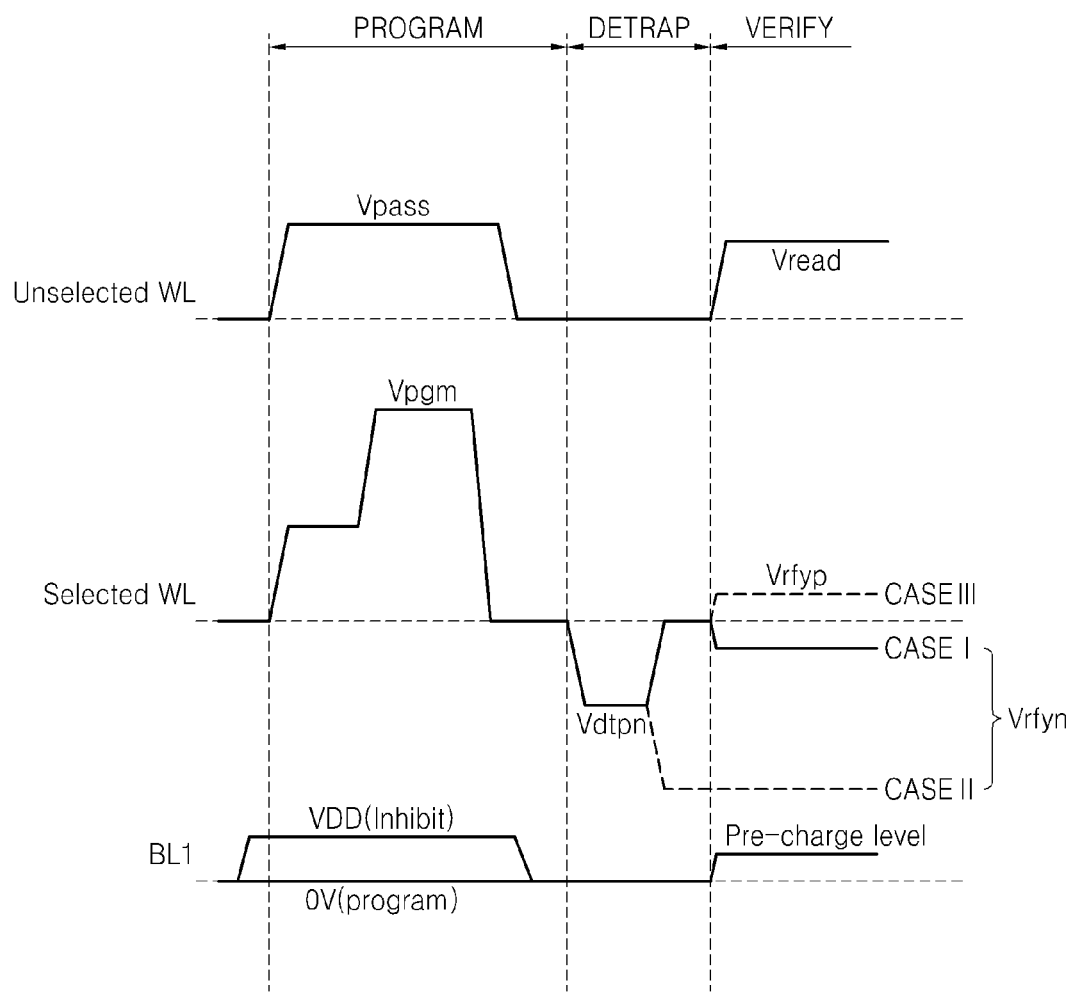
FIG. 5 is a timing chart of voltages applied to the cell string according to some example embodiments.

FIG. 4 is a diagram showing voltages applied to the cell string 20'-1 during a detrapping operation according to some example embodiments. FIG. 5 is a timing chart of voltages applied to the cell string 20'-1 according to some example embodiments.

Referring to FIGS. 1 through 5, during a program operation PROGRAM, in response to the row address XADD the row decoder 40 supplies the program voltage Vpgm output from the high voltage generator 30 to the selected word line WL2 among the word lines WL1 through WLn, supplies a pass voltage Vpass to the unselected word lines WL1 and WL3 through WLn, and supplies the power supply voltage VDD to the string selection line SSL1 connected to a gate of the first selection transistor ST11. At this time, a ground voltage is supplied to the ground selection line GSL1 connected to a gate of the second selection transistor ST21, the common source line CSL, and bulk of each of the non-volatile memory cells.

During the program operation PROGRAM, either a first positive voltage or the ground voltage may be supplied to the bit line BL1 of the cell string 20'-1. The first positive voltage may be the power supply voltage VDD.

When data "0" is programmed to the selected memory cell 21, the ground voltage is supplied to the bit line BL1. When the selected memory cell 21 is in an erased state or it is verified that data "0" has been successfully programmed to the selected memory cell 21 in a previous verify operation, the first positive voltage, e.g., the power supply voltage VDD, is supplied to the bit line BL1. When the first positive voltage, e.g., the power supply voltage VDD, is supplied to the bit line BL1, the bit line BL1 enters to an inhibit state.

When programming data "0" to the selected memory cell 21, the non-volatile memory device 10 may use an incremental step pulse programming (ISPP) scheme. In other words, the non-volatile memory device 10 repeatedly performs a program operation and a verify operation until data "0" is successfully programmed to the selected memory cell 21 or until a predetermined number of program operations is reached. The previous verify operation is a process of verifying whether data "0" has been successfully programmed to the selected memory cell 21 at a previous pulse level in the ISPP scheme.

During a detrapping operation DETRAP, in response to the row address XADD the row decoder 40 supplies a first negative voltage output from the high voltage generator 30 as the negative detrapping voltage Vdtpn to the selected word line WL2 among the word lines WL1 through WLn, supplies the ground voltage (e.g., 0 V) to the unselected word lines WL and WL3 through WLn, and supplies the power supply voltage VDD to the string selection line SSL1 connected to the gate of the first selection transistor ST11. At this time, the ground voltage is supplied to the ground selection line GSL1 connected to the gate of the second selection transistor ST21, the common source line CSL, and bulk of each of the non-volatile memory cells.

During a program verify operation VERIFY, in response to the row address XADD the row decoder 40 supplies a second negative voltage output from the high voltage generator 30 as the negative verify voltage Vvfyn to the selected word line WL2 among the word lines WL1 through WLn and supplies the read voltage Vread to the unselected word lines WL1 and WL3 through WLn, the string selection line SSL1 connected to the gate of the first selection transistor ST11, and the ground selection line GSL1 connected to the gate of the second selection transistor ST21. At this time, the ground voltage is supplied to the common source line CSL and bulk of each of the non-volatile memory cells. The negative verify voltage Vvfyn may be higher (CASE I) or lower (CASE II) than the negative detrapping voltage Vdtpn. Alternatively, the positive verify voltage Vvfyp may be applied to the selected word line WL2 among the word lines WL1 through WLn as shown in CASE III.

Figure 6:
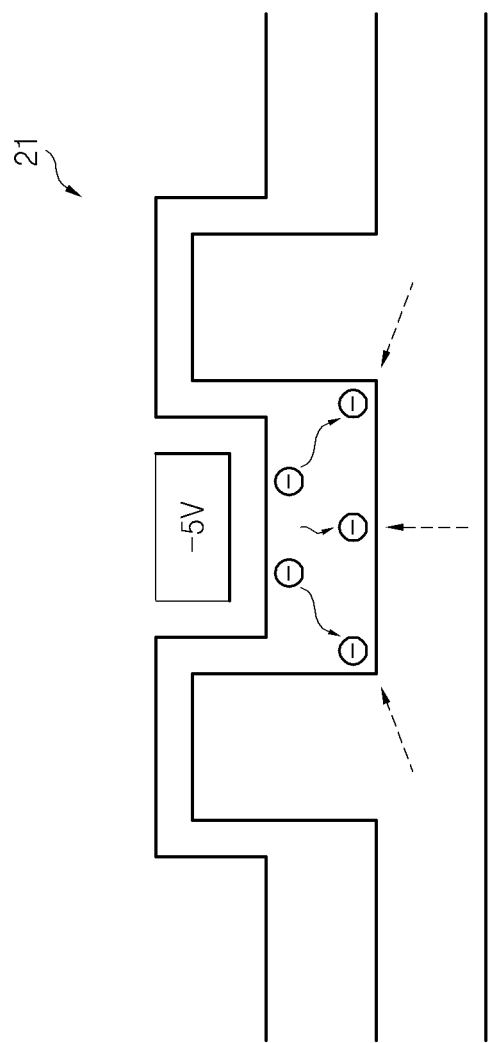
FIG. 6 is a cross-sectional view of a selected memory cell illustrated in FIG. 4.

FIG. 6 is a cross-sectional view of the selected memory cell 21 illustrated in FIG. 4. Referring to FIGS. 1, 3, and 4 through 6, after the program voltage Vpgm is supplied to the selected memory cell 21, the negative detrapping voltage Vdtpn is supplied to a control gate of the selected memory cell 21. At this time, the negative detrapping voltage Vdtpn may be −5 V.

Some of charges trapped by the program voltage Vpgm in a charge trap region of the selected memory cell 21 (e.g., a floating gate of the selected memory cell 21 or a charge trap layer when the selected memory cell 21 is implemented by a charge trap flash (CTF) memory cell) are moved out of the charge trap region by the negative detrapping voltage Vdtpn. In FIG. 6, dotted arrows show the direction of an electric field which is opposite to the direction of an electric field formed during a program operation.

As some of the charges trapped in the charge trap region are moved out of the charge trap region, only charges trapped in the charge trap region may influence the change in the threshold voltage of the selected memory cell 21 during a program verify operation. In other words, the change occurring in the threshold voltage of the selected memory cell 21 due to charge spreading is minimized.

Figure 7:
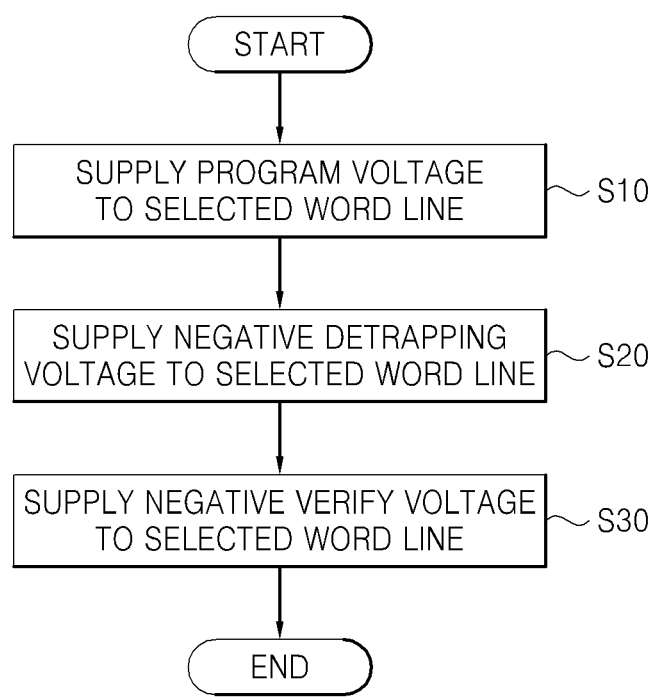
FIG. 7 is a flowchart of the operations of the non-volatile memory device illustrated in FIG. 1, according to some example embodiments.

FIG. 7 is a flowchart of the operations of the non-volatile memory device 10 illustrated in FIG. 1, according to some example embodiments. The operations of the non-volatile memory device 10 will be described with reference to FIGS. 1, 3, and 4 through 7.

As illustrated in FIG. 5, during the program operation PROGRAM, the row decoder 40 supplies the program voltage Vpgm output from the high voltage generator 30 to the selected word line WL2 among the word lines WL1 through WLn in response to the row address XADD in operation S10. At this time, the row decoder 40 supplies the pass voltage Vpass to the unselected word lines WL1 and WL3 through WLn.

As illustrated in FIGS. 4 and 5, during the detrapping operation DETRAP, the row decoder 40 supplies the first negative voltage output from the high voltage generator 30 as the negative detrapping voltage Vdtpn to the selected word line WL2 among the word lines WL1 through WLn in response to the row address XADD in operation S20. As the negative detrapping voltage Vdtpn is supplied to a gate of the selected memory cell 21, some of charges trapped by the program voltage Vpgm in the charge trapping region are moved out of the charge trap region by the negative detrapping voltage Vdtpn. Accordingly, the change occurring in the threshold voltage of the selected memory cell 21 due to charge spreading is minimized.

During the program verify operation VERIFY, the row decoder 40 supplies the second negative voltage output from the high voltage generator 30 as the negative verify voltage Vvfyn to the selected word line WL2 among the word lines WL1 through WLn and the read voltage Vread to the unselected word lines WL1 and WL3 through WLn in response to the row address XADD in operation S30.

Figure 8:
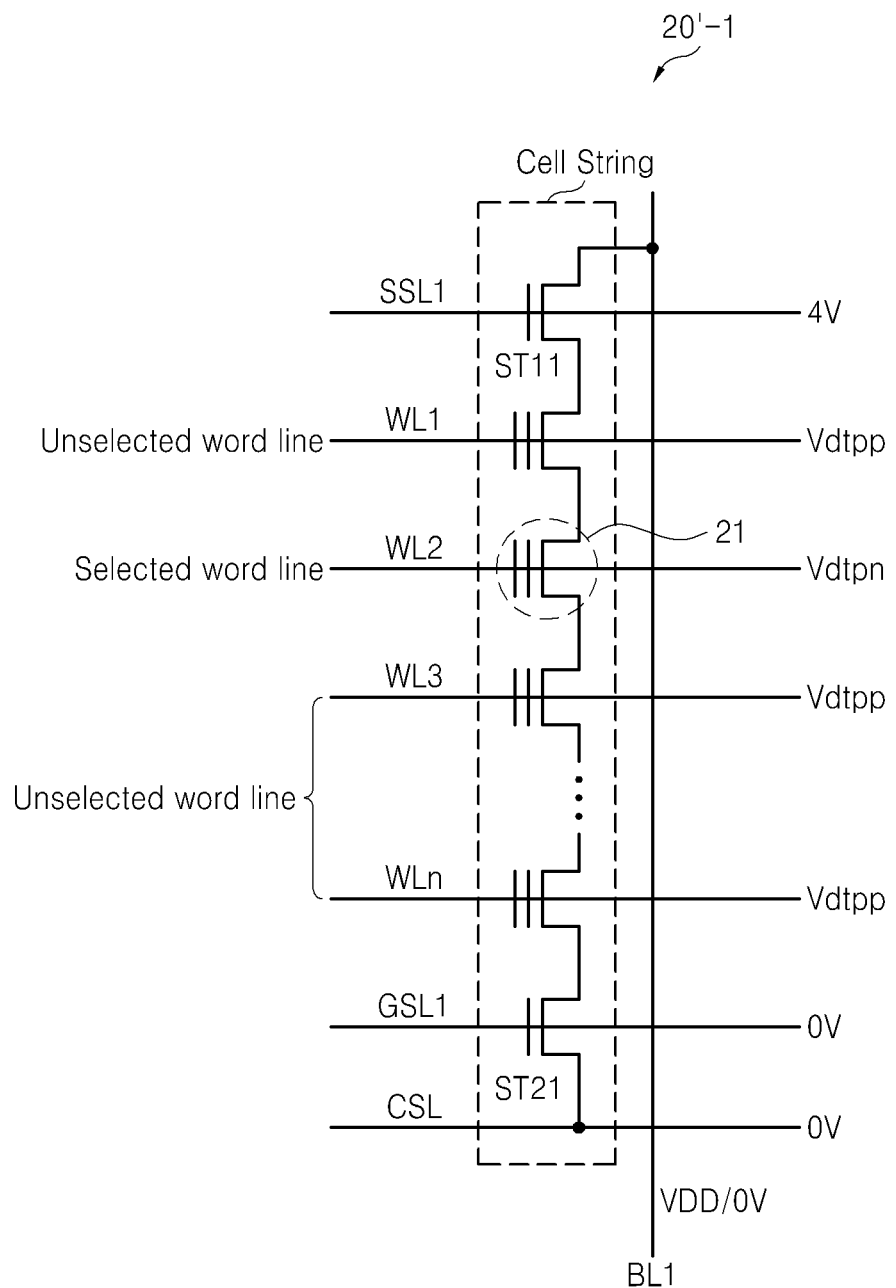
FIG. 8 is a diagram showing voltages applied to the cell string during detrapping according to other example embodiments.
Figure 9:
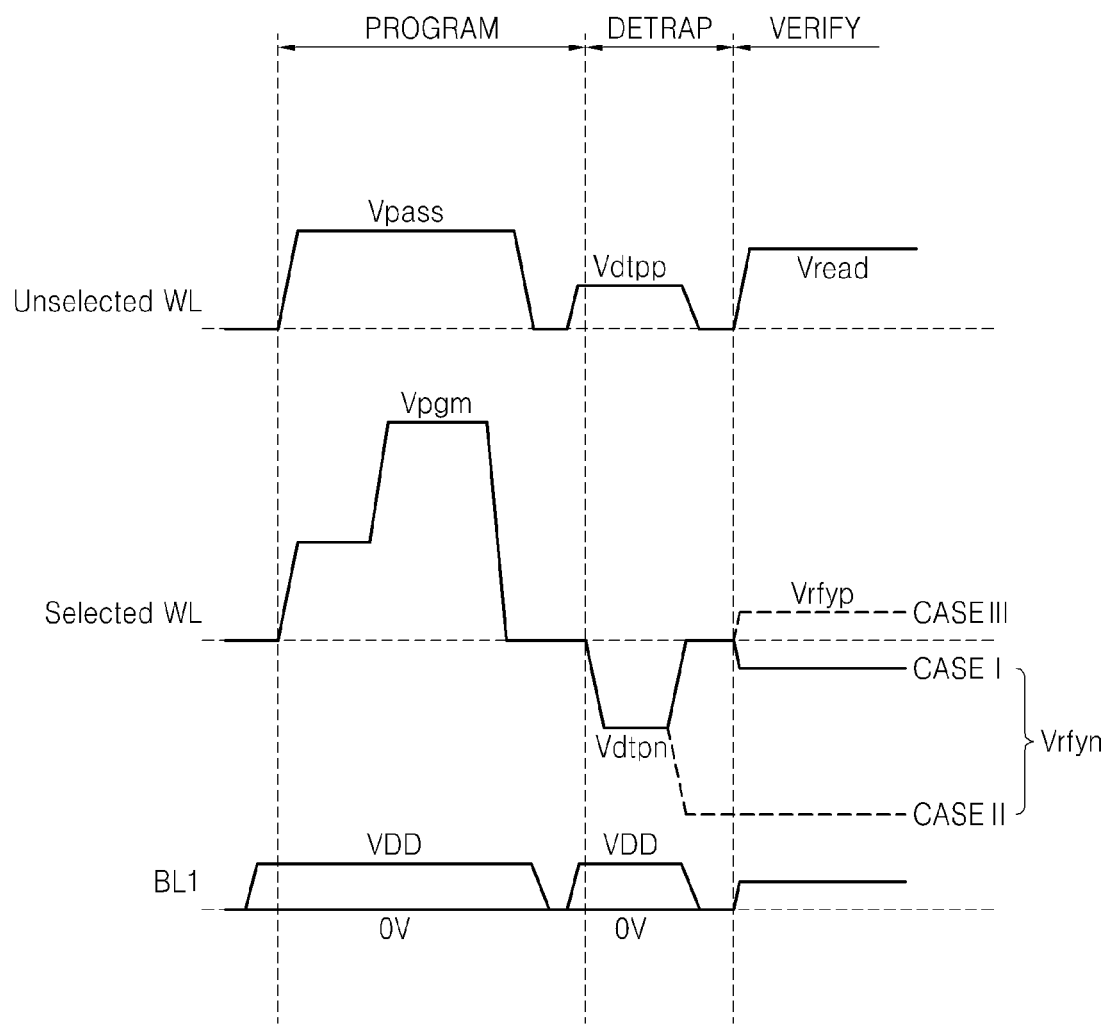
FIG. 9 is a timing chart of voltages applied to the cell string according to other example embodiments.

FIG. 8 is a diagram showing voltages applied to the cell string 20'-1 during a detrapping operation according to other example embodiments. FIG. 9 is a timing chart of voltages applied to the cell string 20'-1 according to other example embodiments.

The program operation PROGRAM performed in the embodiments illustrated in FIGS. 1, 3, 8, and 9 is the same as that described with reference to FIG. 5. Thus, the description thereof will be omitted.

During the detrapping operation DETRAP, in response to the row address XADD the row decoder 40 supplies a first negative voltage output from the high voltage generator 30 as the negative detrapping voltage Vdtpn to the selected word line WL2 among the word lines WL1 through WLn and supplies a second positive voltage as the positive detrapping voltage Vdtpp to the unselected word lines WL1 and WL3 through WLn. The positive detrapping voltage Vdtpp is lower than the pass voltage Vpass supplied to the unselected word lines WL1 and WL3 through WLn during the program operation PROGRAM. For instance, when the pass voltage Vpass is about 9 V, the positive detrapping voltage Vdtpp may be 4 V.

When the ground voltage, i.e., 0 V is supplied to the bit line BL1 during the program operation PROGRAM, the page buffer 71-1 supplies a third positive voltage to the bit line BL1 during the detrapping operation DETRAP. The third voltage may be the power supply voltage VDD.

During the detrapping operation DETRAP, the row decoder 40 also supplies a fourth positive voltage to the string selection line SSL1 connected to the gate of the first selection transistor ST11. The fourth positive voltage may be higher than the sum of the threshold voltage of the first selection transistor ST11 and the power supply voltage VDD. For instance, the power supply voltage VDD may be about 2.8 V and the fourth voltage may be 4 V.

As the row decoder 40 supplies the fourth positive voltage to the string selection line SSL1, the third positive voltage (e.g., the power supply voltage VDD) may be supplied to the word lines WL1 through WLn of the cell string 20'-1 when the third positive voltage is supplied to the bit line BL1. At this time, the ground voltage is supplied to the ground selection line GSL1 connected to the gate of the second selection transistor ST21, the common source line CSL, and bulk of each of the non-volatile memory cells.

When the third positive voltage is supplied to the bit line BL1, the first selection transistor ST11 is turned on. The ground voltage is supplied to the ground selection line GSL1 connected to the gate of the second selection transistor ST21 to turn off the second selection transistor ST21. At this time, a channel voltage of the cell string 20'-1 is charged to the third positive voltage (e.g., the power supply voltage VDD) less the threshold voltage of the first selection transistor ST11.

When the channel voltage of the cell string 20'-1 is charged to the third positive voltage (e.g., the power supply voltage VDD) less the threshold voltage of the first selection transistor ST11, the first selection transistor ST11 is turned off and the channel voltage of the cell string 20'-1 floats. At this time, the channel voltage of the cell string 20'-1 is boosted by capacitive coupling.

As a result, some of charges trapped by the program voltage Vpgm in the charge trap region of the selected memory cell 21 are moved out of the charge trap region by the positive detrapping voltage Vdtpp. Accordingly, the change occurring in the threshold voltage due to charge spreading is minimized.

When the first positive voltage (e.g., the power supply voltage VDD) explained with reference to FIG. 4 is supplied to the bit line BL1 during the program operation PROGRAM, the row decoder 40 supplies the ground voltage to the bit line BL1 during the detrapping operation DETRAP. At this time, the row decoder 40 supplies the first negative voltage output from the high voltage generator 30 as the negative detrapping voltage Vdtpn to the selected word line WL2 among the word lines WL1 through WLn in response to the row address XADD.

During the detrapping operation DETRAP, the amount of charge spreading occurring when the ground voltage is supplied to the bit line BL1 is less than that occurring when the third positive voltage is supplied to the bit line BL1. Accordingly, the change of the threshold voltage of the selected memory cell 21 connected to the inhibited bit line BL1 during the program operation PROGRAM is minimized. Consequently, when the page buffer 71-1 changes a voltage supplied to the bit line BL1 during the detrapping operation DETRAP depending on a voltage supplied to the bit line BL1 during the program operation PROGRAM, the charge spreading of the selected memory cell 21 connected to the inhibited bit line BL1 is minimized.

The program verify operation VERIFY performed in the embodiments illustrated in FIGS. 1, 3, 8, and 9 is the same as that described with reference to FIG. 5. Thus, the description thereof will be omitted.

Figure 10:
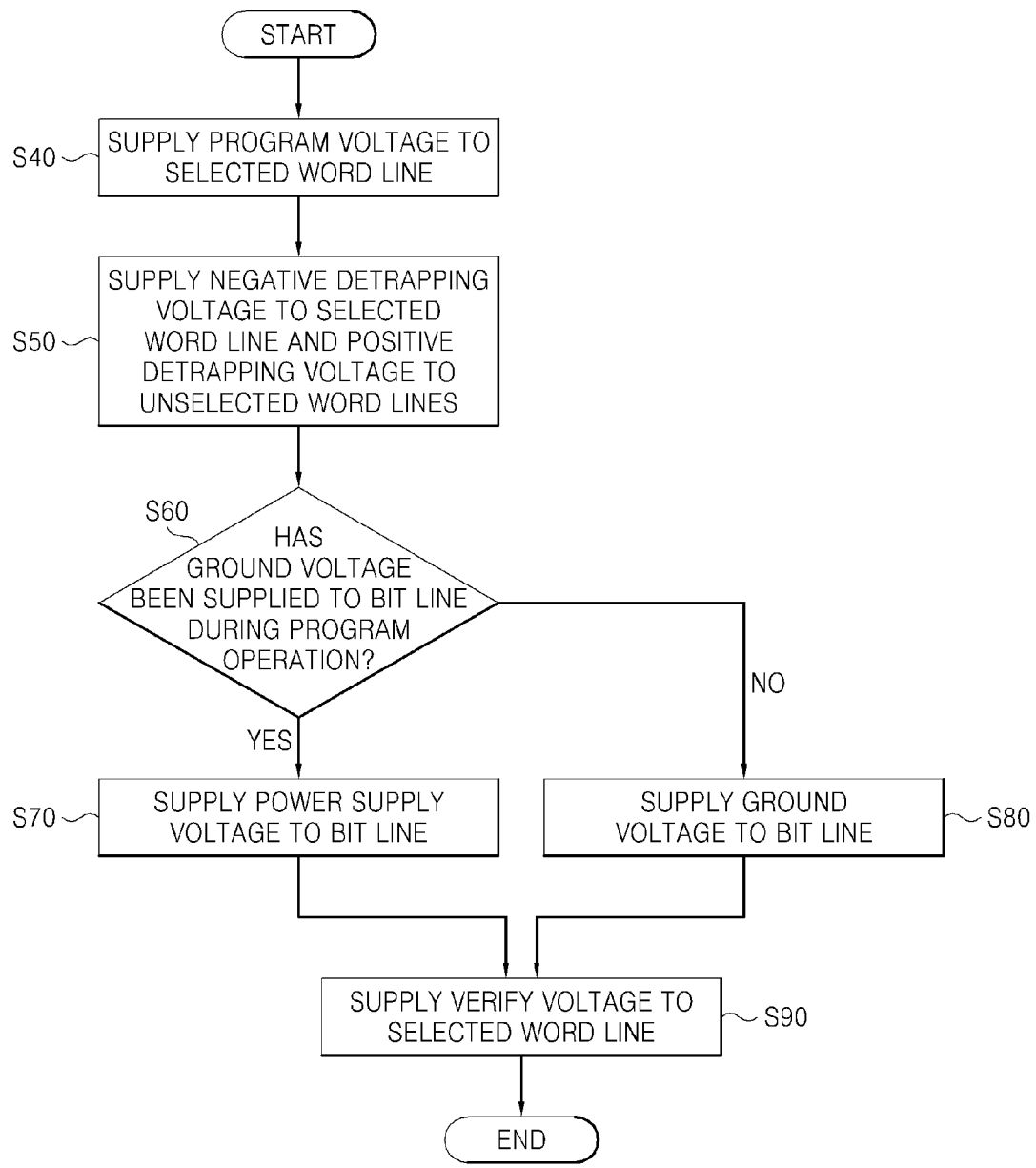
FIG. 10 is a flowchart of the operations of the non-volatile memory device illustrated in FIG. 1, according to other example embodiments.

FIG. 10 is a flowchart of the operations of the non-volatile memory device 10 illustrated in FIG. 1, according to other example embodiments. Referring to FIGS. 1, 3, and 8 through 10, during the program operation PROGRAM, the row decoder 40 supplies the program voltage Vpgm output from the high voltage generator 30 to the selected word line WL2 among the word lines WL1 through WLn and the pass voltage Vpass to the unselected word lines WL1 and WL3 through WLn in response to the row address XADD in operation S40.

During the detrapping operation DETRAP, the row decoder 40 supplies the first negative voltage output from the high voltage generator 30 as the negative detrapping voltage Vdtpn to the selected word line WL2 among the word lines WL1 through WLn and supplies the second positive voltage as the positive detrapping voltage Vdtpp to the unselected word lines WL1 and WL3 through WLn in response to the row address XADD in operation S50. The positive detrapping voltage Vdtpp is lower than the pass voltage Vpass.

The determination logic 52 determines a voltage (e.g., 0 V or VDD) supplied to the bit line BL1 during the detrapping operation DETRAP based on a voltage (e.g., VDD or 0 V) supplied to the bit line BL1 during the program operation PROGRAM in operation S60. When the ground voltage is supplied to the bit line BL1 during the program operation PROGRAM, the page buffer 71-1 supplies the third positive voltage (e.g., the power supply voltage VDD) to the bit line BL1 in operation S70. When the first positive voltage (e.g., the power supply voltage VDD) described above with reference to FIG. 4 is supplied to the bit line BL1 during the program operation PROGRAM, the page buffer 71-1 supplies the ground voltage to the bit line BL1 in operation S80.

During the program verify operation VERIFY, the row decoder 40 supplies the second negative voltage output from the high voltage generator 30 as the negative verify voltage Vvfyn to the selected word line WL2 among the word lines WL1 through WLn and the read voltage Vread to the unselected word lines WL1 and WL3 through WLn in response to the row address XADD in operation S90. Alternatively, as shown in CASE III in FIG. 9, the positive verify voltage Vvfyp may be supplied to the selected word line WL2.

Figure 11:
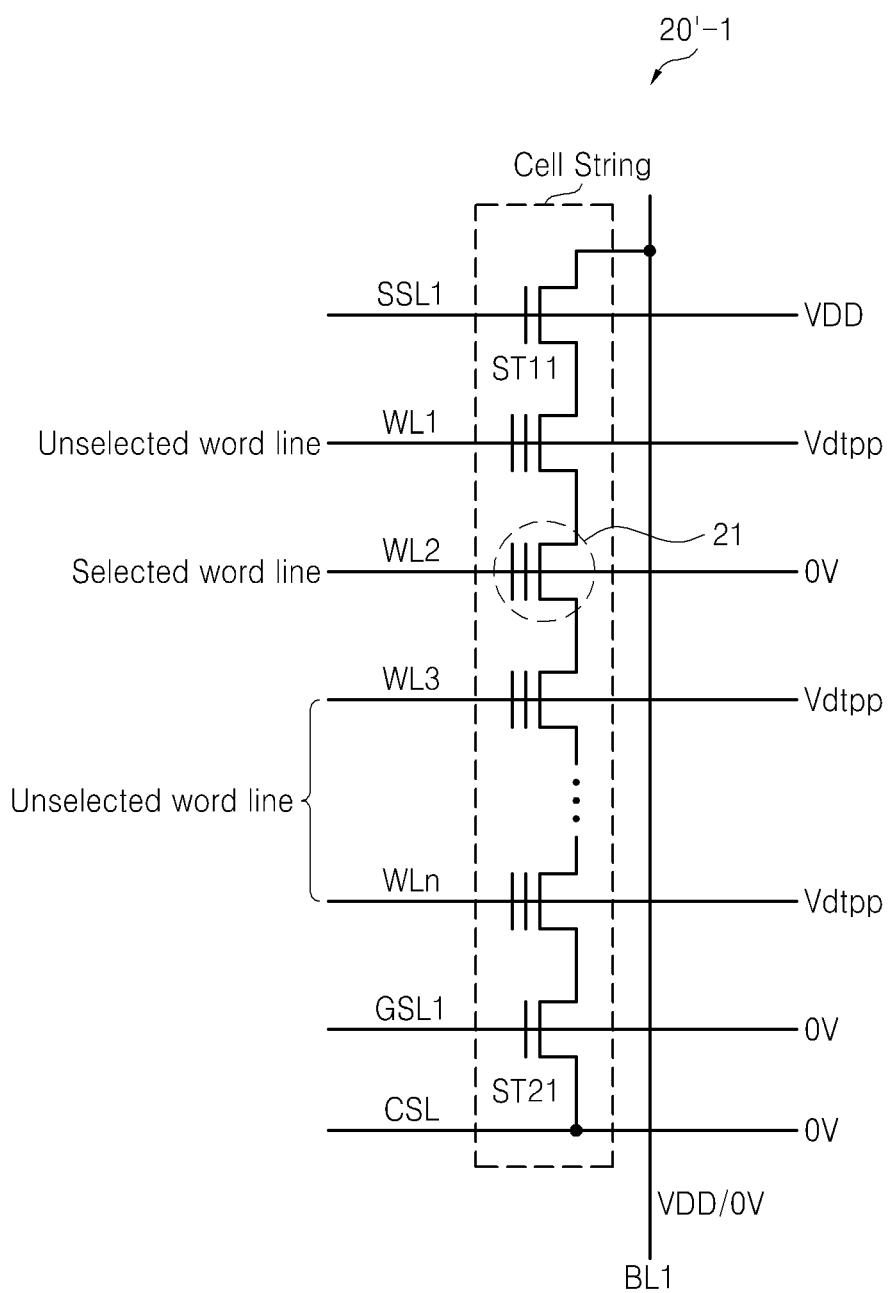
FIG. 11 is a diagram showing voltages applied to the cell string during detrapping according to further example embodiments.
Figure 12:
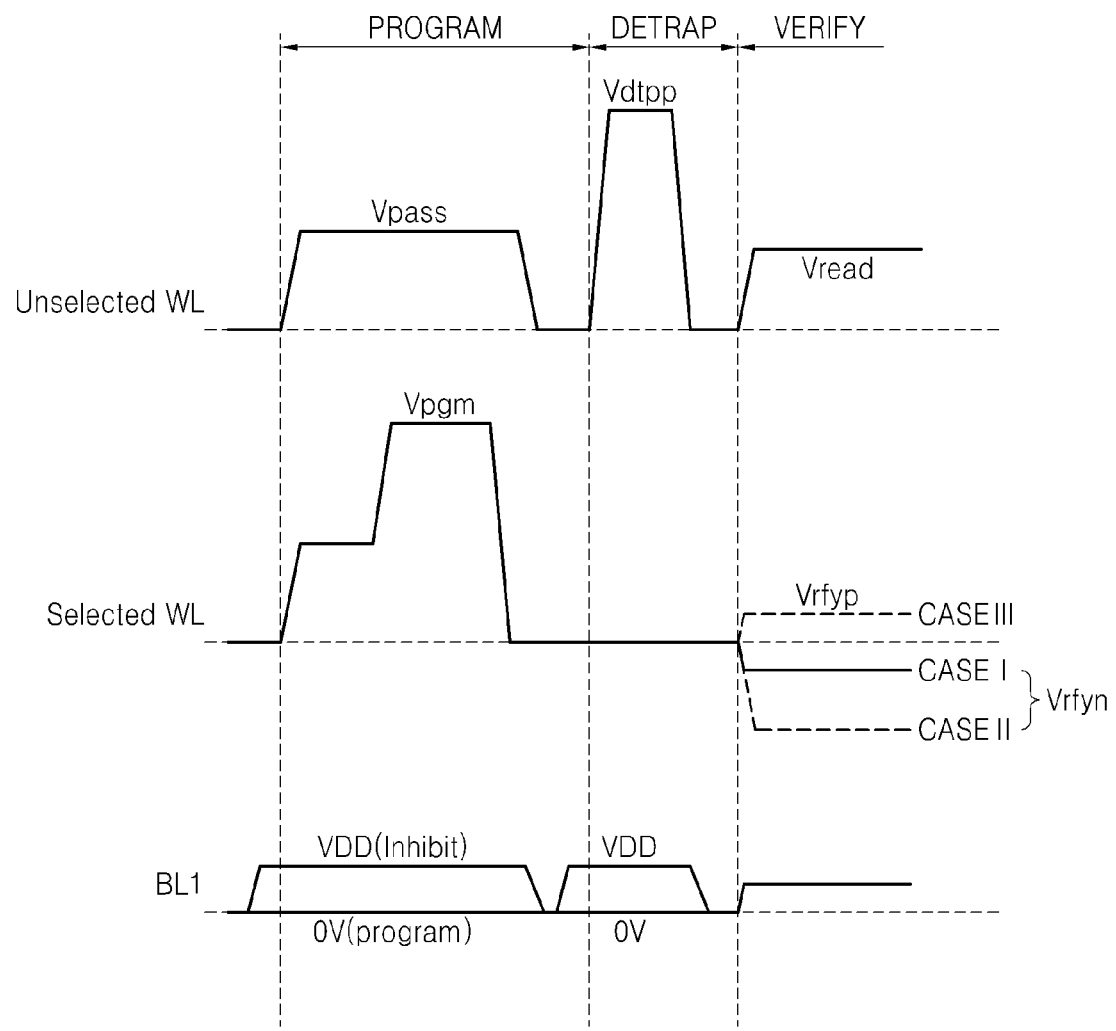
FIG. 12 is a timing chart of voltages applied to the cell string according to further example embodiments.

FIG. 11 is a diagram showing voltages applied to the cell string 20'-1 during a detrapping operation according to further example embodiments. FIG. 12 is a timing chart of voltages applied to the cell string 20'-1 according to further example embodiments.

The program operation PROGRAM performed in the embodiments illustrated in FIGS. 1, 3, 11, and 12 is the same as that described with reference to FIG. 8. Thus, the description thereof will be omitted.

When the ground voltage, i.e., 0 V is supplied to the bit line BL1 during the program operation PROGRAM as described above with reference to FIG. 8, the page buffer 71-1 supplies a third positive voltage to the bit line BL1 during the detrapping operation DETRAP. The third positive voltage may be the power supply voltage VDD.

During the detrapping operation DETRAP, the row decoder 40 supplies the power supply voltage VDD to the string selection line SSL1 connected to the gate of the first selection transistor ST11. At this time, the ground voltage is supplied to the ground selection line GSL1 connected to the gate of the second selection transistor ST21, the common source line CSL, and bulk of each of the non-volatile memory cells.

When the third positive voltage (e.g., the power supply voltage VDD) is supplied to the bit line BL1, the first selection transistor ST11 is turned on. The ground voltage is supplied to the ground selection line GSL1 connected to the gate of the second selection transistor ST21 to turn off the second selection transistor ST21. At this time, a channel voltage of the cell string 20'-1 is charged to the third positive voltage less the threshold voltage of the first selection transistor ST11. When the channel voltage of the cell string 20'-1 is charged to the third positive voltage less the threshold voltage of the first selection transistor ST11, the first selection transistor ST11 is turned off and the channel voltage of the cell string 20'-1 floats.

During the detrapping operation DETRAP, the row decoder 40 also supplies a second positive voltage output from the high voltage generator 30 as the positive detrapping voltage Vdtpp to the unselected word lines WL1 and WL3 through WLn in response to the row address XADD. The ground voltage may be supplied to the selected word lines WL2. At this time, the channel voltage of the cell string 20'-1 is boosted by capacitive coupling. As a result, some of charges trapped by the program voltage Vpgm in the charge trap region of the selected memory cell 21 are moved out of the charge trap region by the boosted channel voltage of the cell string 20'-1, so that the change occurring in the threshold voltage due to charge spreading is minimized.

When the first positive voltage described with reference to FIG. 8 is supplied to the bit line BL1 during the program operation PROGRAM, the page buffer 71-1 supplies the ground voltage to the bit line BL1 during the detrapping operation DETRAP. At this time, the ground voltage is supplied to the selected word line WL2.

During the detrapping operation DETRAP, the amount of charge spreading occurring in the selected memory cell 21 when the ground voltage is supplied to the bit line BL1 is less than that occurring in the selected memory cell 21 when the third positive voltage is supplied to the bit line BL1. Accordingly, the change of the threshold voltage of the selected memory cell 21 connected to the inhibited bit line BL1 during the program operation PROGRAM is minimized.

During the program verify operation VERIFY, in response to the row address XADD the row decoder 40 supplies a negative voltage output from the high voltage generator 30 as the negative verify voltage Vvfyn to the selected word line WL2 among the word lines WL1 through WLn and supplies the read voltage Vread to the unselected word lines WL1 and WL3 through WLn, the string selection line SSL1 connected to the gate of the first selection transistor ST11, and the ground selection line GSL1 connected to the gate of the second selection transistor ST21. At this time, the ground voltage is supplied to the common source line CSL and bulk of each of the non-volatile memory cells. Alternatively, the positive verify voltage Vvfyp may be applied to the selected word line WL2 among the word lines WL1 through WLn.

Figure 13:
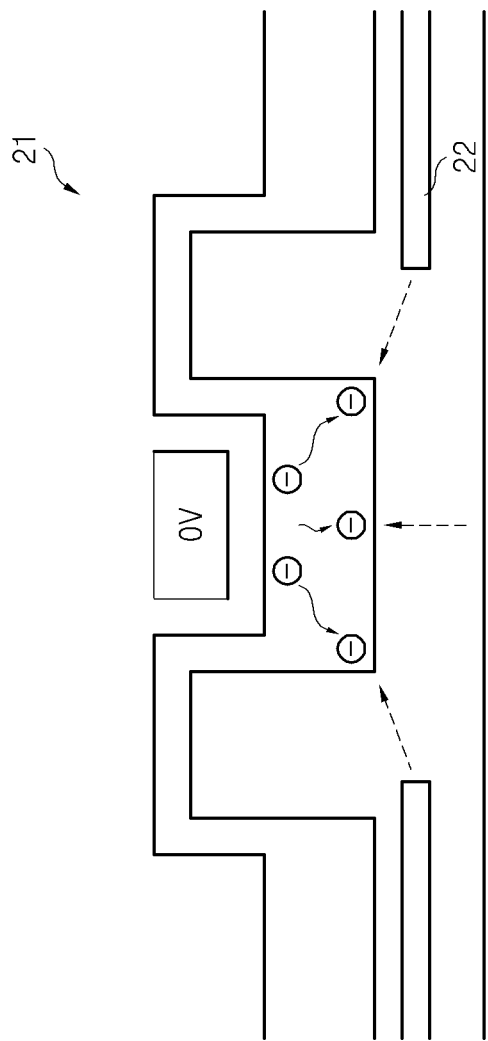
FIG. 13 is a cross-sectional view of a selected memory cell illustrated in FIG. 11.

FIG. 13 is a cross-sectional view of the selected memory cell 21 illustrated in FIG. 11. Referring to FIGS. 1, 3, and 11 through 13, after the program voltage Vpgm is supplied to the selected memory cell 21, the ground voltage is supplied to a gate of the selected memory cell 21.

During the detrapping operation DETRAP, when a voltage of a channel 22 of the cell string 20'-1 is boosted, that is, when the second positive voltage (e.g., the power supply voltage VDD) is supplied to the bit line BL1, some of charges trapped by the program voltage Vpgm are moved by the boosted voltage of the channel 22 of the cell string 20'-1. The dotted arrows indicate the direction of an electric field which is opposite to the direction of an electric field formed during the program operation PROGRAM. As some of the trapped charges are moved, only charges trapped in the selected memory cell 21 may influence the change in the threshold voltage during the program verify operation VERIFY. Accordingly, the change occurring in the threshold voltage due to charge spreading is minimized.

During the detrapping operation DETRAP, when the voltage of the channel 22 of the cell string 20'-1 is not boosted, that is, when the ground voltage is supplied to the bit line BL1, the amount of charges trapped by the program voltage Vpgm and then moved is less than that when the voltage of the channel 22 is boosted. As a result, charge spreading is prevented from relatively occurring again in the inhibited bit line BL1, and therefore, the change in the threshold voltage of the inhibited bit line BL1 is minimized.

Figure 14:
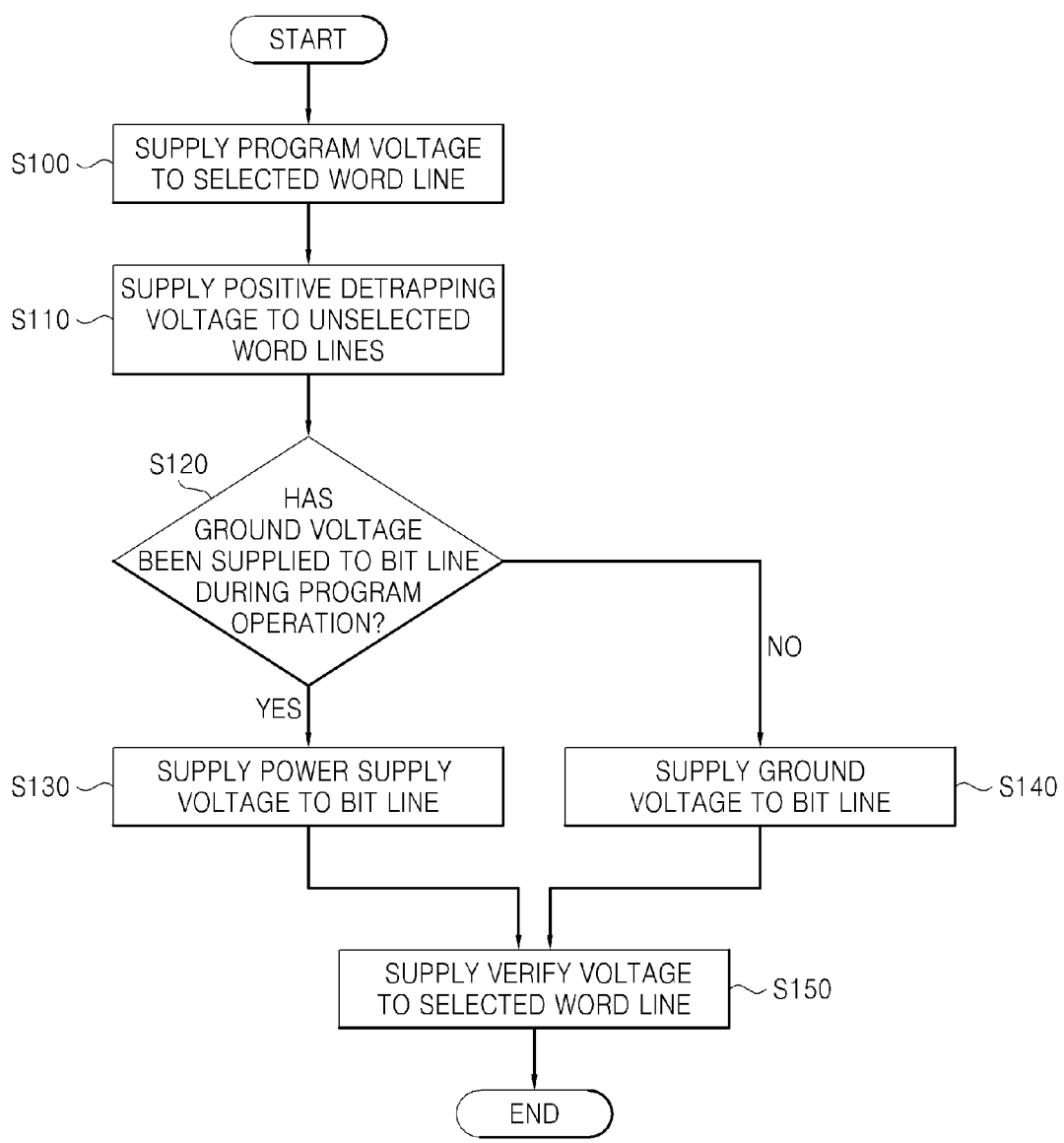
FIG. 14 is a flowchart of the operations of the non-volatile memory device illustrated in FIG. 1, according to further example embodiments.

FIG. 14 is a flowchart of the operations of the non-volatile memory device 10 illustrated in FIG. 1, according to further example embodiments. Referring to FIGS. 1, 3, and 11 through 14, during the program operation PROGRAM, the row decoder 40 supplies the program voltage Vpgm output from the high voltage generator 30 to the selected word line WL2 among the word lines WL1 through WLn in response to the row address XADD in operation S100.

During the detrapping operation DETRAP, the row decoder 40 supplies the second positive voltage output from the high voltage generator 30 as the positive detrapping voltage Vdtpp to the unselected word lines WL1 and WL3 through WLn in response to the row address XADD in operation S110.

The determination logic 52 determines a voltage supplied to the bit line BL1 during the detrapping operation DETRAP based on a voltage supplied to the bit line BL1 during the program operation PROGRAM in operation S120. When the ground voltage is supplied to the bit line BL1 during the program operation PROGRAM, the page buffer 71-1 supplies the third positive voltage (e.g., the power supply voltage VDD) to the bit line BL1 in operation S130. When the first positive voltage (e.g., the power supply voltage VDD) described above with reference to FIG. 4 is supplied to the bit line BL1 during the program operation PROGRAM, the page buffer 71-1 supplies the ground voltage to the bit line BL1 in operation S140.

During the program verify operation VERIFY, the row decoder 40 supplies the second negative voltage output from the high voltage generator 30 as the negative verify voltage Vvfyn to the selected word line WL2 among the word lines WL1 through WLn in response to the row address XADD in operation 5150. Alternatively, the positive verify voltage Vvfyp may be supplied to the selected word line WL2.

Figure 15:
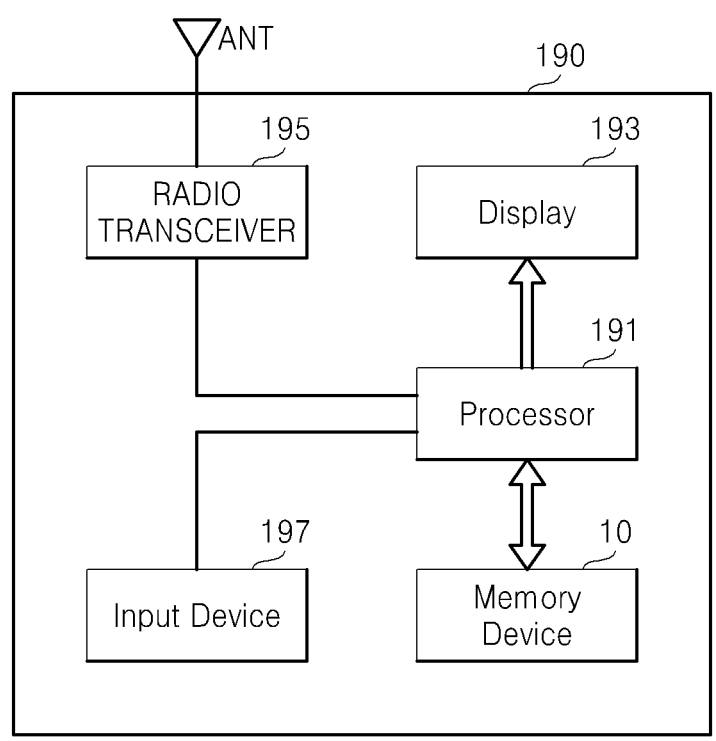
FIG. 15 is a block diagram of an electronic apparatus including the non-volatile memory device illustrated in FIG. 1 according to some example embodiments.

FIG. 15 is a block diagram of an electronic apparatus 190 including the non-volatile memory device 10 illustrated in FIG. 1 according to some example embodiments. Referring to FIG. 15, the electronic apparatus 190 may be a cellular phone, a smart phone, or a wireless Internet system and includes the memory device 10 which performs a detrapping operation inducing charge spreading between a program operation and a verify operation and a processor 191 which controls data processing, e.g., the detrapping operation, of the memory device 10. Data, e.g., programmed bits, stored in the memory device 10 may be controlled by the processor 191 to be displayed through a display 193.

The radio transceiver 195 transmits or receives radio signals through an antenna ANT. The radio transceiver 195 may convert radio signals received through the antenna ANT into signals that can be processed by the processor 191. Accordingly, the processor 191 may process the signals output from the radio transceiver 195 and store the processed signals in the memory device 10 or display them through the display 193. The radio transceiver 195 may also convert signals output from the processor 191 into radio signals and outputs the radio signals through the antenna ANT.

The input device 197 enables control signals for controlling the operation of the processor 191 or data to be processed by the processor 191 to be input to the electronic apparatus 190. The input device 197 may be implemented by a pointing device such as a touch pad or a computer mouse, a keypad, or a keyboard.

The processor 191 may control the operation of the display 193 to display data output from the memory device 10, data output from the radio transceiver 195, or data output from the input device 197.

Figure 16:
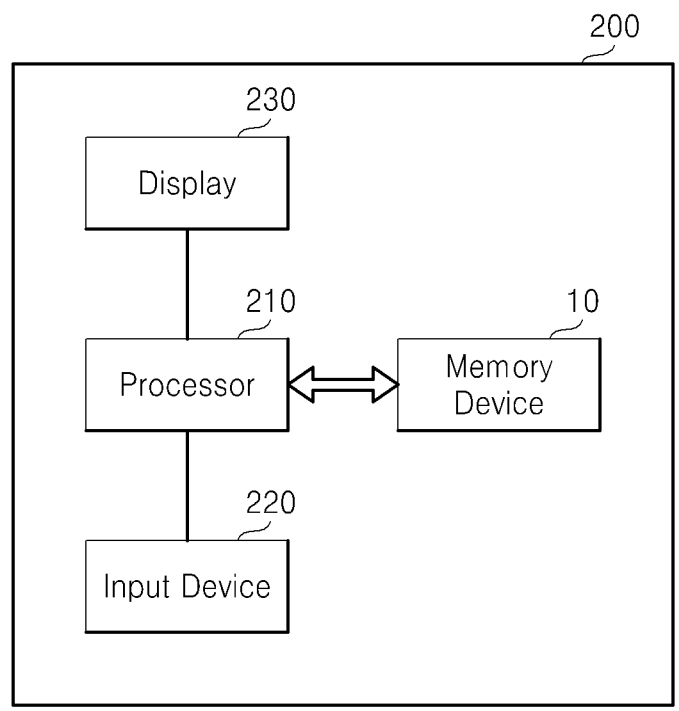
FIG. 16 is a block diagram of an electronic apparatus including the non-volatile memory device illustrated in FIG. 1 according to other example embodiments.

FIG. 16 is a block diagram of an electronic apparatus 200 including the memory device 10 illustrated in FIG. 1 according to other example embodiments. The electronic apparatus 200 may be a data processor such as a tablet computer, a netbook, an e-reader, a personal digital assistant (PDA), a portable multimedia player (PMP), an MP3 player, or an MP4 player. The electronic apparatus 200 includes the memory device 10 performing a detrapping operation and a processor 210 controlling the data processing operation of the memory device 10.

The processor 210 may display data stored in the memory device 10 through a display 230 in response to an input signal generated by an input device 220. The input device 220 may be implemented by a pointing device such as a touch pad or a computer mouse, a keypad, or a keyboard.

Figure 17:
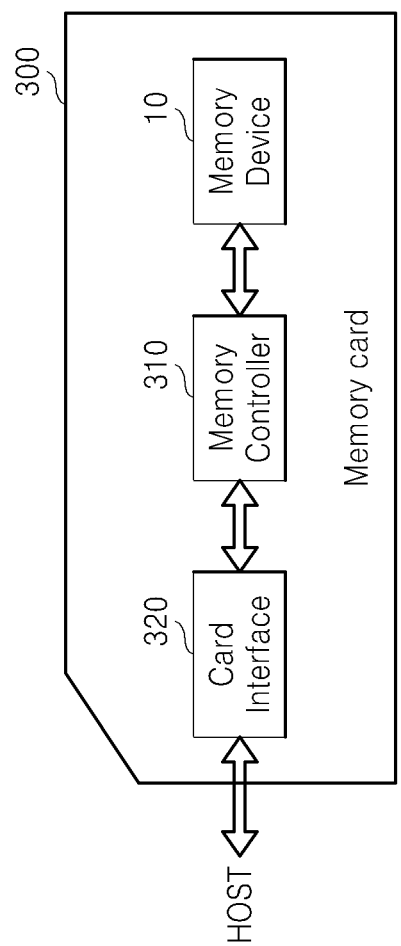
FIG. 17 is a block diagram of an electronic apparatus including the non-volatile memory device illustrated in FIG. 1 according to further example embodiments.

FIG. 17 is a block diagram of an electronic apparatus 300 including the memory device 10 illustrated in FIG. 1 according to further example embodiments. The electronic apparatus 300 may be a memory card or a smart card. The electronic apparatus 300 includes the memory device 10, a memory controller 310, and a card interface 320.

The memory controller 310 may control data exchange between the memory device 10 and the card interface 320. The card interface 320 may be a secure digital (SD) card interface or a multi-media card (MMC) interface, but some example embodiments are not restricted to the current embodiments. The card interface 320 may interface a host and the memory controller 310 for data exchange according to a protocol of the host. When the electronic apparatus 300 is connected with a host such as a computer, a digital camera, a digital audio player, a cellular phone, a consol video game hardware, or a digital set-top box, the host may transmit data to or receive data from the memory device 10 through the card interface 320 and the memory controller 310.

Figure 18:
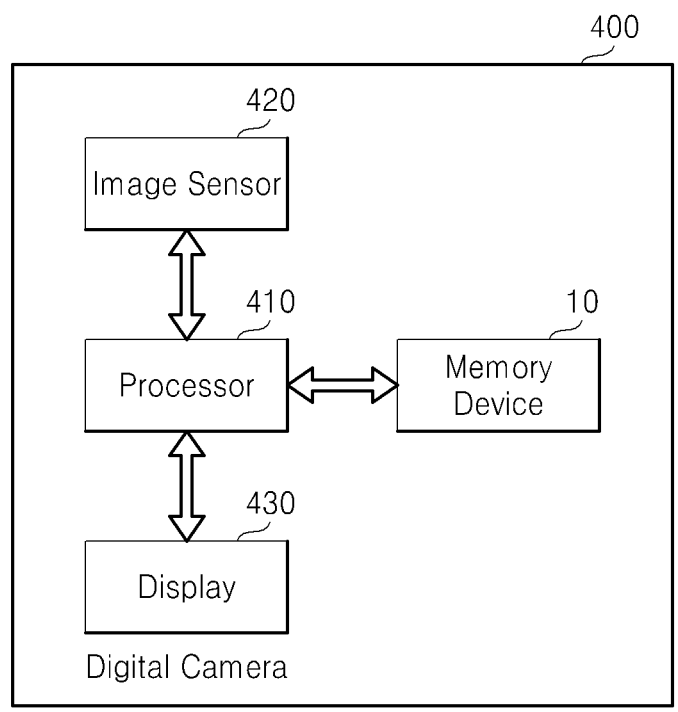
FIG. 18 is a block diagram of an electronic apparatus including the non-volatile memory device illustrated in FIG. 1 according to other example embodiments.

FIG. 18 is a block diagram of an electronic apparatus 400 including the non-volatile memory device illustrated in FIG. 1 according to other example embodiments. The electronic apparatus 400 may be a digital camera or a cellular phone equipped with a digital camera. The electronic apparatus 400 includes the memory device 10 performing a detrapping operation and a processor 410 controlling the data processing operation of the memory device 10.

The image sensor 420 included in the electronic apparatus 400 converts optical images into digital signals. The digital signals are controlled by the processor 410 to be stored in the memory device 10 or displayed through a display 430. The digital signals stored in the memory device 10 may also be controlled by the processor 410 to be displayed through the display 430.

Figure 19:
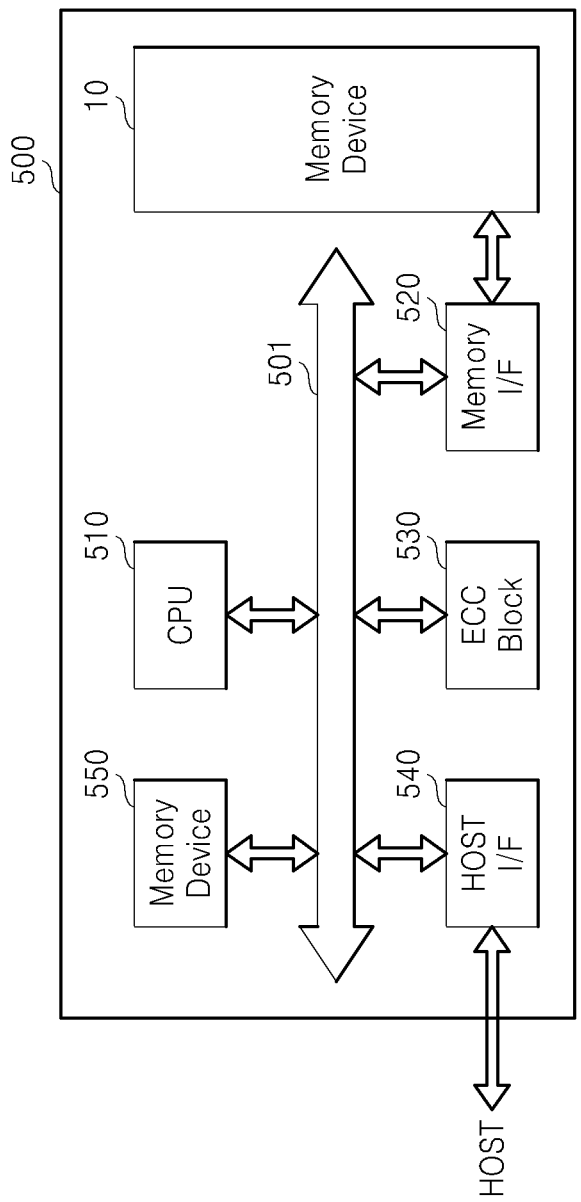
FIG. 19 is a block diagram of an electronic apparatus including the non-volatile memory device illustrated in FIG. 1 according to yet other example embodiments.

FIG. 19 is a block diagram of an electronic apparatus 500 including the memory device 10 illustrated in FIG. 1 according to yet other example embodiments. The electronic apparatus 500 includes the memory device 10 and a central processing unit (CPU) 510 controlling the operation of the memory device 10. The electronic apparatus 500 also includes another memory device 550 an operation memory of the CPU 510. The memory device 550 may be implemented by a non-volatile memory like read-only memory (ROM).

A host connected with the electronic apparatus 500 may transmit data or receive data from the memory device 10 through a memory interface 520 and a host interface 540. An error correction code (ECC) block 530 is controlled by the CPU 510 to detect and correct errors in data read from the memory device 10 through the memory interface 520.

The CPU 510 controls data exchange among the memory interface 520, the ECC block 530, the host interface 540, and the memory device 550 through a bus 501. The electronic apparatus 500 may be a universal serial bus (USB) memory drive or memory stick.

Figure 20:
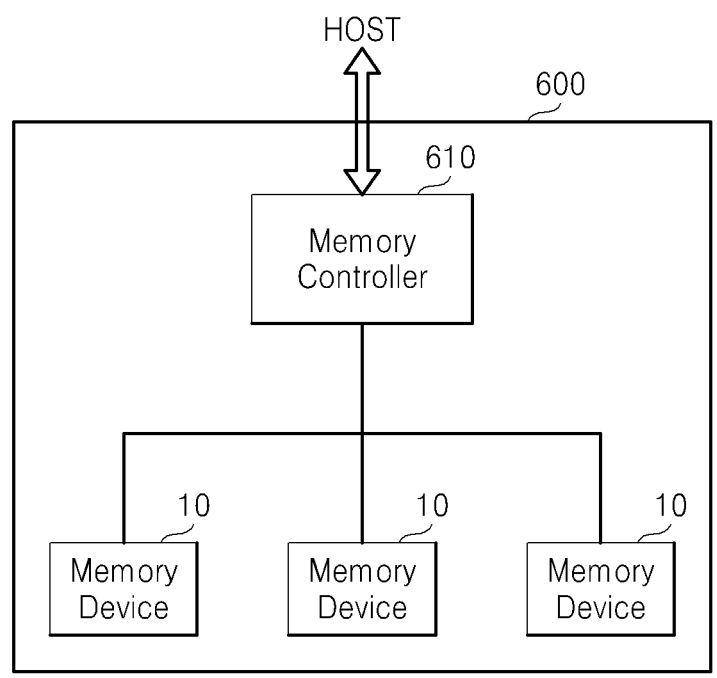
FIG. 20 is a block diagram of an electronic apparatus including the non-volatile memory device illustrated in FIG. 1 according to still other example embodiments.

FIG. 20 is a block diagram of an electronic apparatus 600 including the memory device 10 illustrated in FIG. 1 according to still other example embodiments. The electronic apparatus 600 may be a data storage system like a solid state drive (SSD). The electronic apparatus 600 includes a plurality of memory devices 10 and a memory controller 610 controlling the data processing operation of the memory devices 10. The electronic apparatus 600 may be implemented by a memory module.

Figure 21:
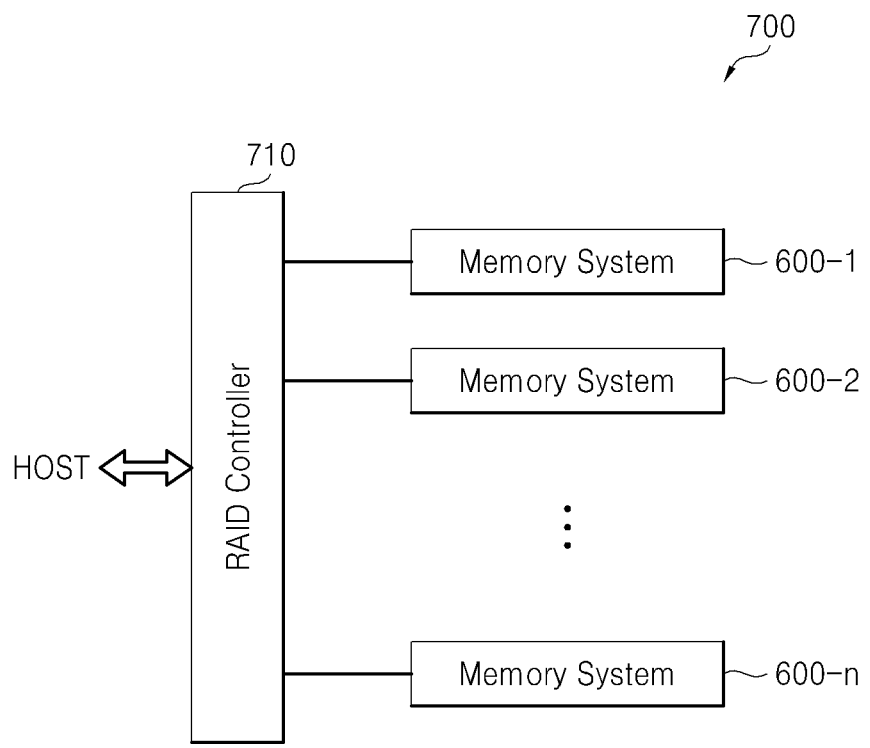
FIG. 21 is a block diagram of a data processing apparatus including the electronic apparatus illustrated in FIG. 20 according to some example embodiments.

FIG. 21 is a block diagram of a data processing apparatus 700 including the electronic apparatus 600 illustrated in FIG. 20 according to some example embodiments. The data processing apparatus 700 may be implemented by a redundant array of independent disks (RAID). The data processing apparatus 700 includes a RAID controller 710 and a plurality of modules 600-1 through 600-$n$ where "n" is a natural number.

Each of the modules 600-1 through 600-$n$ may be the electronic apparatus 600 illustrated in FIG. 20. The modules 600-1 through 600-$n$ may form a RAID array. The data processing apparatus 700 may be implemented as a personal computer or an SSD.

During a program operation, the RAID controller 710 may transmit program data received from a host to one of the modules 600-1 through 600-$n$ according to one RAID level selected from among a plurality of RAID levels in response to a program command received from the host. During a read operation, the RAID controller 710 may transmit to the host data read from one of the modules 600-1 through 600-$n$ according to one RAID level selected from among a plurality of RAID levels in response to a read command received from the host.

According to some example embodiments, an operation inducing charge spreading is performed in advance between the program operation and the verify operation of a non-volatile memory device, so that charge spreading is reduced after the verify operation.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of programming a non-volatile memory device, the method comprising:
   supplying a program voltage to a selected word line among a plurality of word lines included in a cell string;
   supplying a first negative voltage to the selected word line;
   supplying a positive detrapping voltage to unselected word lines among the plurality of word lines; and
   supplying a second negative voltage as a verify voltage to the selected word line.

2. The method of claim 1, further comprising:
   supplying a positive pass voltage to the unselected word lines while supplying the program voltage,
   wherein,
      the positive detrapping voltage is supplied to the unselected word lines while the first negative voltage is supplied to the selected word line, and
      the positive detrapping voltage is lower or higher than the positive pass voltage.

3. A method of programming a non-volatile memory device, the method comprising:
   supplying a program voltage to a selected word line among a plurality of word lines comprised in a cell string;
   supplying a pass voltage to unselected word lines among the plurality of word lines;
   supplying one voltage among a power supply voltage and a ground voltage to a bit line connected to the cell string;
   supplying a first negative voltage to the selected word line and supplying a positive voltage lower than the pass voltage to the unselected word lines; and
   supplying a second negative voltage as a verify voltage to the selected word line.

4. The method of claim 3, further comprising:
   supplying one voltage among the power supply voltage and the ground voltage to the bit line based on the voltage that has been supplied to the bit line when the positive voltage is supplied to the unselected word lines.

5. The method of claim 4, wherein the operation of supplying one voltage among the power supply voltage and the ground voltage to the bit line comprises:
   supplying the ground voltage to the bit line after the program voltage is supplied to the selected word line and the power supply voltage is supplied to the bit line; and
   supplying the power supply voltage to the bit line after the program voltage is supplied to the selected word line and the ground voltage is supplied to the bit line.

6. The method of claim 3, further comprising:
   the operation of supplying a voltage higher than the power supply voltage to a string selection line of the cell string when the positive voltage is supplied to the unselected word line.

7. The method of claim 3, wherein the second negative voltage is lower or higher than the first negative voltage.

8. A method of programming a non-volatile memory device, the method comprising:
   supplying a program voltage to a selected word line among a plurality of word lines comprised in a cell string;
   supplying a pass voltage to unselected word lines among the plurality of word lines;
   supplying one voltage among a power supply voltage and a ground voltage to a bit line connected to the cell string;
   supplying a positive voltage higher than the pass voltage to the unselected word lines and supplying one voltage among the power supply voltage and the ground voltage to the bit line based on the voltage that has been supplied to the bit line; and
   supplying a verify voltage to the selected word line.

9. The method of claim 8, wherein the supplying one voltage among the power supply voltage and the ground voltage to the bit line comprises:
   supplying the ground voltage to the bit line after the program voltage is supplied to the selected word line and the power supply voltage is supplied to the bit line; and
   supplying the power supply voltage to the bit line after the program voltage is supplied to the selected word line and the ground voltage is supplied to the bit line.

10. The method of claim 8, wherein the verify voltage is higher or lower than the ground voltage.

* * * * *